United States Patent
Sharma et al.

(10) Patent No.: US 9,742,424 B2
(45) Date of Patent: Aug. 22, 2017

(54) ANALOG-TO-DIGITAL CONVERTER

(71) Applicant: Nanyang Technological University, Singapore (SG)

(72) Inventors: Sunny Sharma, Singapore (SG); Chirn Chye Boon, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 15/400,093

(22) Filed: Jan. 6, 2017

(65) Prior Publication Data

US 2017/0201268 A1 Jul. 13, 2017

(30) Foreign Application Priority Data

Jan. 7, 2016 (SG) .............................. 10201600101T

(51) Int. Cl.
| | |
|---|---|
| *H03M 1/00* | (2006.01) |
| *H03M 1/46* | (2006.01) |
| *H03M 1/12* | (2006.01) |
| *H03M 1/10* | (2006.01) |

(52) U.S. Cl.
CPC ........... *H03M 1/46* (2013.01); *H03M 1/1009* (2013.01); *H03M 1/1245* (2013.01)

(58) Field of Classification Search
CPC ..... H03M 1/46; H03M 1/1009; H03M 1/1245
USPC .......................................... 341/110, 120, 155
See application file for complete search history.

(56) References Cited

U.S. PATENT DOCUMENTS

| | | | | |
|---|---|---|---|---|
| 8,928,504 B2* | 1/2015 | Su | ........................ | H03M 1/1009 341/110 |
| 2013/0207818 A1* | 8/2013 | Moldsvor | ........... | H03M 1/1009 341/120 |
| 2014/0043175 A1* | 2/2014 | Fogleman | ............. | H03M 1/462 341/110 |

OTHER PUBLICATIONS

Kuttner, "A 1.2V 10b 20MSample/s non-binary successive approximation ADC in 0.13µm CMOS", Solid-State Circuits Conference, 2002. Digest of Technical Papers. ISSCC. 2002 IEEE International , vol. 1, No. pp. 176,177 vol. 1, 7-7 Feb. 2002.
Liu et al., "A 10b 100MS/s 1.13mW SAR ADC with Binary-Scaled Error Compensation". Digest of Technical Papers. ISSCC. 2010, pp. 386-388, Feb. 10, 2010.

(Continued)

*Primary Examiner* — Jean B Jeanglaude
(74) *Attorney, Agent, or Firm* — Royse Law Firm, PC

(57) ABSTRACT

An analog-to-digital converter (ADC) is provided, having two comparators, two digital-to-analog converters (DACs), and an adder circuit. The ADC receives an input value and, over a plurality of conversion cycles of the ADC, generates an output value representative of the input value. Each respective DAC generates a plurality of threshold levels, which are defined, at least in part, by predetermined redundancy levels that are binary-scaled. The comparator arrangement provides an output code in a respective conversion cycle and, for at least two adjacent conversion cycles, the two comparators collectively provide 2-bit output codes. The adder circuit provides a plurality of output bits of the output value, and is capable of overlapping and adding a first significant bit of the 2-bit output code provided for a predetermined conversion cycle with a second significant bit of the 2-bit output code provided for a previous conversion cycle to generate one output bit.

20 Claims, 15 Drawing Sheets

(56) References Cited

OTHER PUBLICATIONS

Cho, et al., "A 550μW 10-b 40-MS/s SAR ADC With Multistep Addition-Only Digital Error Correction", IEEE Journal of Solid-State Circuits,, vol. 46, No. 8, pp. 1881-1892, Aug. 2011.
Rahimi et al., "Energy-efficient high-accuracy switching method for SAR ADCs", in Electronics Letters, vol. 50, No. 7, pp. 499-501, Mar. 2014.
Ding, et al., "A 5.5fJ/conv-step 6.4MS/s 13b SAR ADC utilizing a redundancyfacilitated background error-detection-and-correction scheme", ISSCC Dig. Tech. Papers, pp. 460, 461, Feb. 2015.
Zhou et al., A 12b 160MS/s synchronous two-step SAR ADC achieving "20.7fj/step FoM with opportunistic digital background calibration", VLSI circuits Symp., pp. 1,2, Jun. 2014.

\* cited by examiner

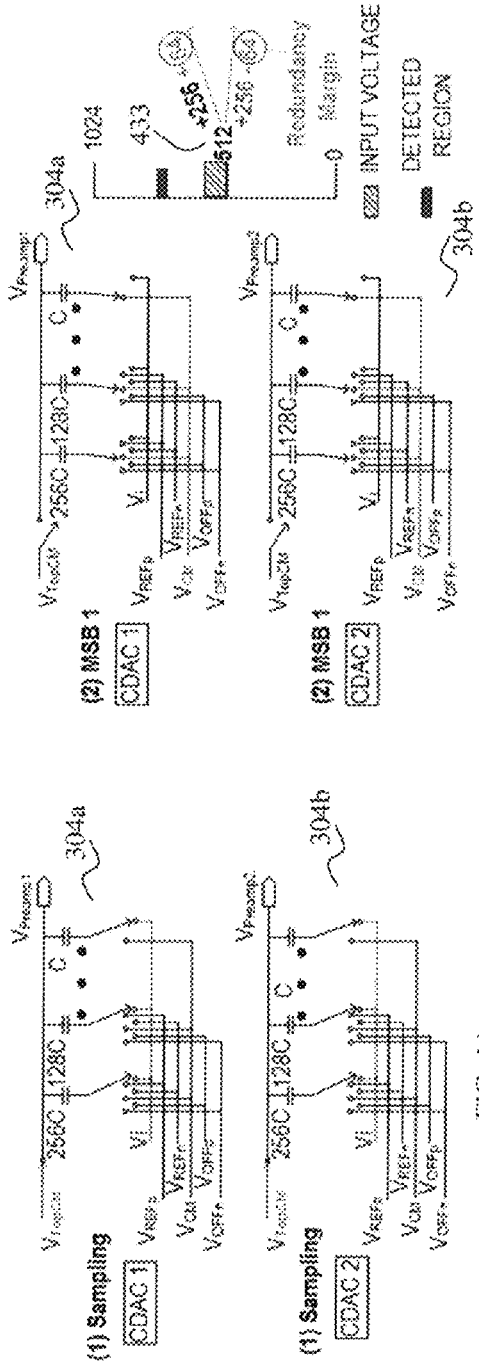
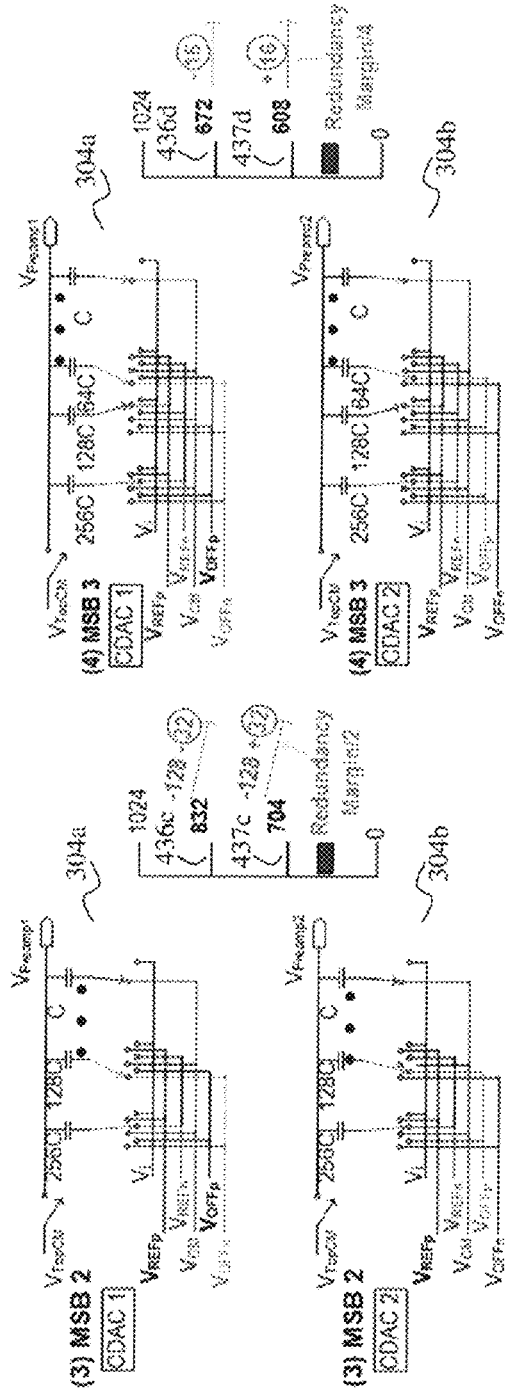
FIG. 4A  FIG. 4B  FIG. 4C  FIG. 4D

ANALOG-TO-DIGITAL CONVERTER

CROSS-REFERENCE TO RELATED APPLICATION

This application claims the benefit of priority of Singapore patent application No. 10201600101T, filed 7 Jan. 2016, the content of it being hereby incorporated by reference in its entirety for all purposes.

TECHNICAL FIELD

Various embodiments relate to an analog-to-digital converter (ADC) and a method of controlling an analog-to-digital converter (ADC).

BACKGROUND

Portable highly integrated systems on chip (SOC) comprising analog, digital and radio frequency circuits have placed stringent requirements on power dissipation, chip area and performance of sub-systems such as ADC's (analog-to-digital converter) operating under noisy SOC environment. Advanced nano-technology manufacturing nodes have enabled reduction in logic delay, power consumption and chip area. This has immensely benefited successive approximation register (SAR) ADC topology due to its highly digital nature. It is quite challenging to design a single channel SAR ADC with 10 bits resolution and over 100 MSps with good linearity and dynamic performance. Time interleaving and pipeline architecture are typically used to enhance speed for a medium resolution ADC design. However, time interleaving requires additional calibration circuits for correcting channel mismatch and stringent clock jitter specification which trickles down to specifications of the phase-locked loop design, responsible for generating ADC clock and the clock distribution network. A pipeline ADC suitable for latency tolerant application has its own challenges for deep sub-micron CMOS (complementary metal-oxide-semiconductor) technology nodes such as designing the power hungry inter-stage residue amplifier operating at lower supply voltages which requires special op-amp design techniques/architectures to achieve the desirable gain. Multiple op-amp stages may have to be cascaded to achieve the desired gain since cascading transistors is not feasible.

Advances in DAC (digital-to-analog converter) switching schemes, high speed dynamic latch comparators, asynchronous timing logic, SAR logic and redundancy have further pushed the speed envelope while achieving low figure of merit. The capacitive DAC (CDAC) poses a significant speed bottle neck, affecting settling behavior and resulting in erroneous conversion result. A 10 bit capacitive DAC (CDAC) requires 7.63 τ time constants for the voltage to settle within a precision of ½ LSB. Only 250 psec is available for DAC settling time for a 150 MSps 10 bits data converter. Additionally, noise coupling from supply rails and DAC reference voltages results in erroneous conversion and degrades dynamic performance. Introducing redundancy and error correction capabilities is beneficial to preserve the dynamic performance of data converters, especially the ones operating within a system on chip's noisy environment.

Complex CDAC architecture including split capacitor, compensative capacitors and asymmetric CDAC metal routing to implement binary and non-binary redundancy methods used to relax DAC settling time limits the DAC resolution, unit capacitor size, capacitor charge transfer time and necessitates additional DAC calibration circuits. Adding redundancy requires additional bit cycles, complex control logic overhead, decoders, shifting input range and complex error correction logic to convert additional redundancy-induced bit cycles output to the required resolution.

Some of the issues or problems related to known devices are as described below.

A typical high performance, safety critical data converter operating in an automotive, System on Chip (SOC) (with analog, digital, radio operation—a typical internet of things (IOT) product) and industrial application is usually plagued with a noisy environment, which affects the operation of an analog-to-digital converter (ADC) causing incorrect digitized results and degraded signal to noise ratio and spurious free dynamic range.

Automotive companies SOC usually overdesign a typical data converter in terms of the resolution (bits) required such that the effective number of bits can meet the safety standards specified by the automotive standards body. With the commercialization push for all electric vehicles and driverless cars, more reliable and energy efficient data converters that can operate in a noisy SOC environment are required.

In some cases, multiple data converters are used for applications such as air bag deployment in a car. Error correction data converters without latency or additional cycles (N+X cycles, where X is additional cycles) for an N bit data converter is a desirable.

In a typical high speed data converter application, a number of parameters such as the digital-to-analog converter (DAC) voltage settling time, comparator regeneration and reset time, control logic delay to switch appropriate weights in a DAC are crucial.

The main challenge for any DAC is the voltage reference settling time, which should settle within less than ½ least significant bit (LSB). Failing which an error is caused in the analog converted digital value for a data converter without redundancy and error correction capability.

In general, sufficient time is allocated for the DAC to settle within VREFp±½ LSB. This leads to a speed bottleneck.

Redundancy can be implemented by either using a binary or non-binary approach. These approaches often require DAC splitting, extra DAC capacitors to add redundancy, hence increasing the control logic complexity which leads to increase in chip area, power consumption and reduced conversion speed. A non-binary implementation uses redundancy in all cycles including the first cycle. A non-binary scaled DAC implemented using thermometer code requires a decoder and $2\times2^N$ switches. Hence, area and power consumption are increased.

Complex high speed single-bit/multi-bit per cycle error correction SAR ADC requires power hungry arithmetic units utilizing shifters, subtractors, adders, multiplexers etc.

The unit capacitor matching of a capacitive DAC sets the total size of a DAC, hence defining the energy minima of the SAR ADC. Capacitor matching is limited with the technology used and is better for lower technology nodes (28 nm and below) as the manufacturing process utilizes dual masks for lithography and better $K_o$ which is the matching coefficient. These technology nodes are extremely costly and capacitor mismatch in DAC degrades the linearity (INL-Integral non linearity, and DNL-Dynamic non linearity) of the ADC. DAC mismatch is one of the important parameters that determines the manufacturing yield of a data converter. Hence a large unit capacitor leading to a large capacitive DAC size is preferred for commercial applications. Mismatch in the capacitor leads to possible loss in linearity (INL and DNL). Additional cycles are required to achieve a 10-bit resolution. In one known implementation, 13 cycles are required to achieve a 12.7% redundancy margin.

In one known implementation, selective redundancy cycles are employed using a preprogrammed amount of redundancy cycles that can be used for error correction. Here, the amount of redundancy cycles determines the number of erroneous decisions that can be corrected. In total, N+X cycles are required to achieve a N-bit resolution (where X is the amount of extra redundancy cycles introduced).

SUMMARY

According to an embodiment, an analog-to-digital converter (ADC) is provided. The analog-to-digital converter may include a comparator arrangement including two comparators, a digital-to-analog converter (DAC) arrangement including two DACs, wherein each DAC of the two DACs is connected to a respective comparator of the two comparators, and an adder circuit connected to the comparator arrangement, wherein the ADC is configured to receive an input value and further configured, over a plurality of conversion cycles of the ADC, to generate an output value representative of the input value, wherein, for each respective DAC, the DAC is configured to sample the input value, and to generate a plurality of threshold levels over the plurality of conversion cycles, the sampled input value and the plurality of threshold levels to be received by the respective comparator, wherein the plurality of threshold levels are defined, at least in part, by predetermined redundancy levels that are binary-scaled over the plurality of conversion cycles and generated by the DAC, and, wherein a respective threshold level of the plurality of threshold levels is associated with a respective conversion cycle of the plurality of conversion cycles, wherein the comparator arrangement is configured to provide an output code in the respective conversion cycle based on the sampled input value and the respective threshold level associated with at least one of the two comparators, and, wherein, for at least two adjacent conversion cycles of the plurality of conversion cycles, the two comparators are adapted to collectively provide output codes having two bits based on the sampled input value and the respective threshold levels associated with the two comparators, wherein the respective threshold levels for a predetermined conversion cycle of the at least two adjacent conversion cycles is dependent on the output code having two bits of a previous conversion cycle of the at least two adjacent conversion cycles, and wherein the adder circuit is configured to provide a plurality of output bits corresponding to the output value, wherein the adder circuit is capable of overlapping and adding a first significant bit of the output code having two bits provided in the predetermined conversion cycle with a second significant bit of the output code having two bits provided in the previous conversion cycle to generate one output bit of the plurality of output bits.

According to an embodiment, a method of controlling an analog-to-digital converter (ADC) is provided. The method may include receiving an input value, and generating an output value representative of the input value over a plurality of conversion cycles of the ADC, wherein generating an output value includes, via each respective digital-to-analog converter (DAC) of two DACs included in a DAC arrangement of the ADC, sampling the input value, and generating a plurality of threshold levels over the plurality of conversion cycles, the sampled input value and the plurality of threshold levels being received by a respective comparator of two comparators included in a comparator arrangement of the ADC, the respective comparator being connected to the respective DAC of the two DACs, wherein the plurality of threshold levels are defined, at least in part, by predetermined redundancy levels that are binary-scaled over the plurality of conversion cycles and generated by the DAC, and, wherein a respective threshold level of the plurality of threshold levels is associated with a respective conversion cycle of the plurality of conversion cycles, providing, via the comparator arrangement, an output code in the respective conversion cycle based on the sampled input value and the respective threshold level associated with at least one of the two comparators, and, wherein, for at least two adjacent conversion cycles of the plurality of conversion cycles, providing, via the two comparators collectively, output codes having two bits based on the sampled input value and the respective threshold levels associated with the two comparators, wherein the respective threshold levels for a predetermined conversion cycle of the at least two adjacent conversion cycles is dependent on the output code having two bits of a previous conversion cycle of the at least two adjacent conversion cycles, and providing, via an adder circuit connected to the comparator arrangement, a plurality of output bits corresponding to the output value, wherein, for generating one output bit of the plurality of output bits, a first significant bit of the output code having two bits provided in the predetermined conversion cycle is overlapped and added by the adder circuit with a second significant bit of the output code having two bits provided in the previous conversion cycle.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIGS. 4A to 4D show schematic examples illustrating the charge redistribution principle based constant common mode fractional reference voltage switching scheme (CCM-FRVSS) procedure, according to various embodiments.

FIG. 5A shows a plot of energy consumption for a known switching scheme implementing 1.5 bits/cycle, while

DETAILED DESCRIPTION

Figure 1A:
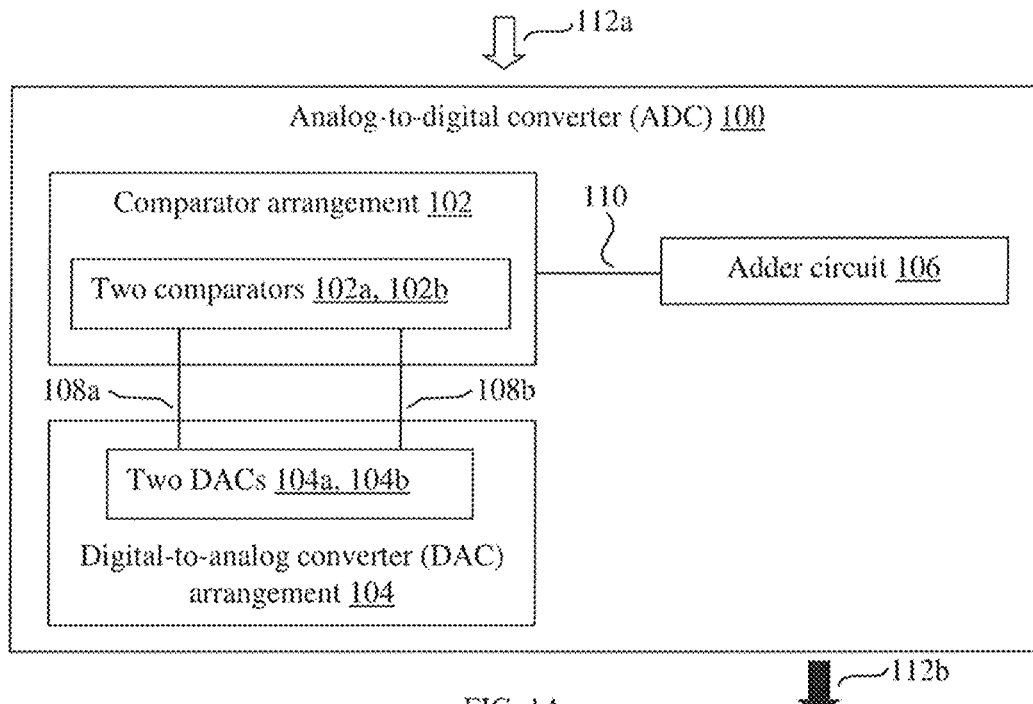
FIG. 1A shows a block diagram of an example analog-to-digital converter (ADC), according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide an asynchronous successive approximation analog-to-digital converter (SAR ADC), for example, an SAR ADC with redundancy and error correction. As a non-limiting example, various embodiments may provide a 10 b (Bits) SAR ADC with binary-scaled redundancy-facilitated error correction.

Various embodiments may provide a 150 MSps 10 bits SAR ADC fabricated in 65-nm CMOS technology. An addition only digital error correction technique may be used to correct up to 3 erroneous decisions in a total of 9-bit cycles. This may be achieved by implementing a binary scaled CDAC (capacitive digital-to-analog converter) utilizing the constant common mode fractional reference voltage switching scheme (CCM-FRVSS) of various embodiments. In various embodiments, 12.5% redundancy margins may be generated to facilitate overlap and addition error correction logic. This may eliminate, or at least minimize, the need for power hungry arithmetic unit, complex digital overhead and need for additional bit cycles. Unlike non-binary redundancy, in various embodiments, no redundancy may be required for bit (conversion) cycle 1, and the data converter implements an initial 1 bit/cycle, followed by 8 cycles of 1.5 bits/cycle conversion. Asynchronous timing logic along with a sequencer to generate bit-cycle specific tokens may be used to optimize the power consumption of the SAR logic implementing cycle specific redundancy. The CCM-FRVSS may save 50% CDAC space and/or may be 90.2% energy efficient when compared to known switching scheme operating with similar error correction capabilities.

The CDAC of various embodiments may include binary scaled metal-over-metal (MOM) unit capacitor of about 0.75 fF. With an active area of approximately 0.038 mm$^2$, the digital error correction circuit may occupy approximately 38×7 μm$^2$, a 45% area reduction compared to the known device. A metal-over-metal capacitor refers to a capacitor having metals (or metal plates) separated by a dielectric therebetween.

One of the challenges for any DAC is the voltage reference settling time, which should settle within less than ½ least significant bit (LSB). In various embodiments, for example, with a silicon test chip tape-out in 65 nm technology of the error correction architecture, a redundancy margin from cycle 2 onwards may be added to relax the DAC settling time within VREFp±Number of Redundant bits.

In various embodiments, redundancy may not be included in the first cycle as this may not be required as the transient time required to settle to the correct input value may be sufficient and may exceed the time constant τ.

Various embodiments may implement one or more of the following: (1) A binary scaled charge redistribution DAC that may relax the DAC voltage settling time, for example, without requiring extra DAC capacitor bank or DAC splitting; (2) A simple error correction algorithm utilizing adders, for example, only adders, e.g., only 7 full adders and 2 half adders; (3) Data converter that may automatically correct up to 3 incorrect decisions during the conversion and/or may require, for example, (only) 9 cycles to compute 10-bit digital output. Hence, zero latency may be provided; and (4) Mismatch in capacitor that may be traded for redundancy margin. Therefore, the total DAC size may be reduced. As a non-limiting example, various embodiments may implement a 0.75 fF metal-over-metal (MOM) unit capacitor in a two-dimensional matrix for a 10-bit SAR ADC. This may only be possible due to trading of redundancy margin for capacitor mismatch.

As non-limiting examples, various embodiments may solve and optimize the use of redundancy and/or error correction by employing an architecture utilizing an initial first cycle as a 1 bit output, with the remaining 8 cycles being 1.5 bits/cycle (for example, for a 10-bit resolution). One or more of the following may be employed:

- The 1.5 bits/cycle may be used by a SAR ADC without utilizing power hungry inter-stage residue amplifiers. The 1.5 bits/cycle SAR architecture of various embodiments may utilize the concept of inherent redundancy and/or error correction capabilities by using a dual comparator approach.
- A 12.5 percent redundancy may be introduced from the 2nd (conversion) cycle onwards, where the 1st (conversion) cycle may not or does not require redundancy as sufficient time may be available for the DAC to settle with a precision of ½ LSB.

This redundancy may be utilized either to relax the reference buffer charging the DAC or traded off for capacitive mismatch of a DAC. Hence, the manufacturing yield of such a data converter implementing the technique of various embodiments may be increased.

$T=\tau \times \ln(\frac{1}{2} \times \frac{1}{2}N)$ is the time required for an N bit DAC to settle within precision of ½ LSB without redundancy. Hence 7.625$\tau$ is required.

Whereas, with redundancy for 2nd cycle, $T=\tau \times \ln(32 \times \frac{1}{2}^{10})$ is required for the DAC to settle within a precision of 32 LSBs. Hence, 3.466$\tau$ is required where the approach of various embodiments is utilized.

A massive saving of 4.159 $\tau$ is achieved which may be translated in either increasing the cycle frequency, enabling faster conversion or relaxing the power consumption of the reference buffer.

- Up to 3 erroneous decisions may be corrected without utilizing additional cycles to achieve an N-bit resolution. As a non-limiting example, N=10 bits. The first (conversion) cycle may be a 1 bit cycle and the remaining 8 (conversion) cycles may be 1.5 bits/cycle. There may not be need or there is no need for the last cycle to be a 2 bits/cycle to achieve a 10-bit resolution. Hence, the use of a 3rd comparator or additional $3^{rd}$ differential DAC may be avoided.

Various embodiments cater not only for an SOC working in a noisy automotive environment but also may provide a solution that takes advantage of Moore's law and better lithography tools to achieve a scalable unit capacitor which may meet the manufacturing yield requirement by utilizing the redundancy concept of various embodiments. The power savings may be traded off to increase the sampling frequency of the ADC core or relax the reference buffer specifications.

FIG. 1A shows a block diagram of an analog-to-digital converter (ADC) 100, according to various embodiments. The ADC 100 includes a comparator arrangement 102 having two comparators 102a, 102b, a digital-to-analog converter (DAC) arrangement 104 having two DACs 104a, 104b, wherein each DAC of the two DACs 104a, 104b is connected to a respective comparator of the two comparators 102a, 102b, and an adder circuit 106 connected to the comparator arrangement 102, wherein the ADC 100 is configured to receive an input value (represented by open arrow 112a) and further configured, over a plurality of conversion cycles of the ADC 100, to generate an output value (represented by closed arrow 112b) representative of the input value 112a, wherein, for each respective DAC 104a, 104b, the DAC 104a, 104b is configured to sample the input value 112a, and to generate a plurality of threshold levels over the plurality of conversion cycles, the sampled input value and the plurality of threshold levels to be received by the respective comparator 102a, 102b, wherein the plurality of threshold levels are defined, at least in part, by predetermined redundancy levels that are binary-scaled over the plurality of conversion cycles and generated by the DAC 104a, 104b, and, wherein a respective threshold level of the plurality of threshold levels is associated with a respective conversion cycle of the plurality of conversion cycles, wherein the comparator arrangement 102 is configured to provide an output code in the respective conversion cycle based on the sampled input value and the respective threshold level associated with at least one of the two comparators 102a, 102b, and, wherein, for at least two adjacent conversion cycles of the plurality of conversion cycles, the two comparators 102a, 102b are adapted to collectively provide output codes having two bits based on the sampled input value and the respective threshold levels associated with the two comparators 102a, 102b, wherein the respective threshold levels for a predetermined conversion cycle of the at least two adjacent conversion cycles is dependent on the output code having two bits of a previous conversion cycle of the at least two adjacent conversion cycles, and wherein the adder circuit 106 is configured to provide a plurality of output bits corresponding to the output value 112b, wherein the adder circuit 106 is capable of overlapping and adding a first significant bit of the output code having two bits provided in the predetermined conversion cycle with a second significant bit of the output code having two bits provided in the previous conversion cycle to generate one output bit of the plurality of output bits.

In other words, an ADC 100 is provided. The ADC 100 may include a comparator arrangement 102 having two comparators (or two comparator circuits) 102a, 102b, and a DAC arrangement 104 having two DACs (or two DAC circuits) 104a, 104b, wherein a respective DAC of the two DACs 104a, 104b may be connected to a respective comparator of the two comparators 102a, 102b. For example, a first DAC 104a may be connected (as represented by line 108a) to a first comparator 102a, while a second DAC 104b may be connected (as represented by line 108b) to a second comparator 102b. The ADC 100 may further include an adder circuit (or adder logic) 106 connected (as represented by line 110) to the comparator arrangement 102.

The ADC 100 may be configured to receive an input value 112a (e.g., an analog input value) and further configured, over a plurality of conversion cycles of the ADC, to generate an output value 112b (e.g., a digital output value) representative of the input value 112a. This may mean that the output value 112b may be generated after a plurality of conversion cycles carried out by the ADC 100. As a non-limiting example, the ADC 100 may be operable to, over the plurality of conversion cycles, successively approximate or converge to the input value 112a, in the form of the output value 112b.

For each respective DAC 104a, 104b, the DAC 104a, 104b may sample the input value 112a, and may generate a plurality of threshold levels over the plurality of conversion cycles, the sampled input value and the plurality of threshold levels to be received by (or provided to) the respective comparator 102a, 102b, wherein the plurality of threshold levels may be defined, at least in part, by predetermined redundancy levels (or margins) that are binary-scaled (binary-weighted) over (successive conversion cycles of) the plurality of conversion cycles and generated by the DAC. A respective threshold level of the plurality of threshold levels may be associated with a respective conversion cycle of the plurality of conversion cycles. Accordingly, part of a respective threshold level may be defined by a respective predetermined redundancy level, meaning that a respective threshold level may be defined by an associated respective predetermined redundancy level in a respective conversion cycle. The plurality of threshold levels may be defined by the predetermined redundancy levels in at least some of the plurality of conversion cycles. Further, the predetermined redundancy levels may be varied over the plurality of conversion cycles based on a binary scale (e.g., $2^n$ where n is an integer), for example, the predetermined redundancy levels may be decreased over the plurality of conversion cycles based on a binary scale, e.g., the predetermined redundancy levels over the plurality of conversion cycles may be 64, 32, 16, etc. In various embodiments, each predetermined redundancy level (or margin) may be a 12.5% redundancy margin.

In various embodiments, therefore, each respective DAC 104a, 104b may generate or may be capable of generating a respective threshold level in each respective conversion cycle of the plurality of conversion cycles such that the respective threshold level may be provided to the respective comparator 102a, 102b. The respective threshold level may define a comparator threshold level of the respective comparator 102a, 102b for comparison against the sampled input value in the respective conversion cycle, where the respective comparator 102a, 102b is enabled or operative to perform the comparison.

The comparator arrangement 102 may provide an output code in the respective conversion cycle based on the sampled input value and the respective threshold level associated with at least one of the two comparators 102a, 102b, and, for at least two adjacent conversion cycles of the plurality of conversion cycles, the two comparators 102a, 102b may collectively provide output codes having two bits (e.g., 2-bit output codes) based on the sampled input value and the respective threshold levels associated with the two comparators 102a, 102b, wherein the respective threshold levels for a predetermined conversion cycle of the at least two adjacent conversion cycles may depend on the 2-bit output code of a previous conversion cycle of the at least two adjacent conversion cycles. This may mean that, depending on the comparison carried out by the comparator arrangement 102 of the sampled input value against one or both of the respective threshold levels of the associated one or both of the respective comparators 102a, 102b, an output code may be generated by the comparator arrangement 102 in each respective conversion cycle of the plurality of conversion cycles. The output code may be a 1-bit output code when (only) one of the two comparators 102a, 102b is enabled in a respective conversion cycle, or a 2-bit output code when both the two comparators 102a, 102b are enabled in a respective conversion cycle. It should be appreciated that one or both of the two comparators may be enabled in any respective conversion cycle.

When (only) one of the two comparators 102a, 102b is enabled in a respective conversion cycle, there is one threshold level, for comparison against the sampled input value, that consequently defines two decision regions (e.g., decision regions "0" and "1" so as to provide a corresponding output code "0" or "1", being a 1-bit output code) into which the sampled input value may be or fall within). Such a conversion cycle may be a 1 bit/cycle. In various embodiments, for a full scale of values in which one threshold level is defined therewithin, the region between the minimum value of the full scale and the threshold level may define a decision region "0", while the region between the threshold level and the maximum value of the full scale may define a decision region "1".

When two comparators 102a, 102b are enabled in a respective conversion cycle, there are two threshold levels, for comparison against the sampled input value, that consequently define three decision regions (e.g., decision regions "00", "01" and "10" so as to provide a corresponding output code "00", "01" and "10", being a 2-bit output code) into which the sampled input value may be or fall within. Such a conversion cycle may be a 1.5 bits/cycle. In various embodiments, for a full scale of values in which two threshold levels are defined therewithin, the region between the minimum value of the full scale and the lower threshold level may define a decision region "00", the region between the lower threshold level and the upper threshold level may define a decision region "01", while the region between the upper threshold level and the maximum value of the full scale may define a decision region "10". A 2-bit output code may be in the form of "AB", where "A" is the most significant bit (MSB) of the output code and "B" is the least significant bit (LSB) of the output code.

As described, the respective threshold level may be variable over the plurality of conversion cycles. This may mean that the respective threshold level that may be provided may be changed accordingly over the plurality of conversion cycles, depending on the output code of a previous or preceding conversion cycle.

In various embodiments, the adder circuit 106 may provide a plurality of output bits corresponding to the output value (e.g., the adder circuit 106 may be adapted to provide at least a part of the output value). The adder circuit 106 may be capable of overlapping and adding (together) a first significant bit of the 2-bit output code provided for the predetermined conversion cycle with a second significant bit of 2-bit output code provided for the previous conversion cycle to generate one output bit of the plurality of output bits. In the context of various embodiments, the terms "first significant bit" and the "second significant bit" may define different significant bits of an output code, meaning that the "first significant bit" and the "second significant bit" may be bits at different positions of the output code. For example, the term "first significant bit" may define the most significant bit (MSB) and the "second significant bit" may define the least significant bit (LSB) of an output code.

In various embodiments, the plurality of output codes for the plurality of conversion cycles may be provided on the basis of the same two comparators 102a, 102b.

In the context of various embodiments, the adder circuit 106 may define or may act as an error correction circuit. This may mean that, by operation of the adder circuit, for example, the overlapping and adding process as described above, any error that may occur may be corrected.

In the context of various embodiments, by providing predetermined redundancy levels that are binary-scaled over the plurality of conversion cycles, error correction may be facilitated. For example, providing binary-scaled predetermined redundancy levels may allow any error that occur to propagate through the different stages of the adder circuit for the purpose of error correction. According, various embodiments may provide an ADC 100 with binary-scaled redundancy-facilitated error correction.

In various embodiments, for an initial conversion cycle of the plurality of conversion cycles, the comparator arrangement 102 may be configurable or configured to provide the output code having one bit (i.e., 1-bit output code), and, for each of remaining conversion cycles of the plurality of conversion cycles, the two comparators 102a, 102b may be adaptable or adapted to collectively provide the output code having two bits (i.e., 2-bit output code). A 2-bit output code may be provided for each of all remaining conversion cycles. This may mean that the (same) two comparators 102a, 102b may be capable of being configured to provide the 2-bit output code in each of (all) the remaining conversion cycles of the plurality of conversion cycles.

In the context of various embodiments, the term "initial conversion cycle" may refer to the starting conversion cycle or the first conversion cycle in time scale, e.g., conversion cycle 1.

In various embodiments, for an initial conversion cycle of the plurality of conversion cycles, the comparator arrangement 102 may be configurable or configured to be a 1 bit/cycle comparator arrangement, and, for each of remaining conversion cycles of the plurality of conversion cycles, the comparator arrangement 102 may be configurable or configured to be a 1.5 bits/cycle comparator arrangement. The comparator arrangement 102 may be configurable or configured to be a 1.5 bits/cycle comparator arrangement for each of all remaining conversion cycles of the plurality of conversion cycles. This may mean that the (same) two comparators 102a, 102b may be capable of being collectively configured as a 1.5 bits/cycle comparator arrangement in (all) the remaining conversion cycles.

In the context of various embodiments, for the comparator arrangement 102 to provide a 1-bit output code or be configured as a 1 bit/cycle comparator arrangement, (only) one of the two comparators 102a, 102b needs to be enabled. For the comparator arrangement 102 to provide a 2-bit output code or be configured as a 1.5 bits/cycle comparator arrangement, both of the two comparators 102a, 102b need to be enabled.

In various embodiments, the ADC 100 may be adaptable or adapted to enable one of the two comparators 102a, 102b for an initial conversion cycle of the plurality of conversion cycles, and to enable both of the two comparators 102a, 102b for each of remaining conversion cycles of the plurality of conversion cycles. Both comparators 102a, 102b may be enabled in each of all the remaining conversion cycles.

In various embodiments, the ADC 100 may be configured to provide the output code for an initial conversion cycle of the plurality of conversion cycles as an output most significant bit (MSB) corresponding to the output value 112b. The adder circuit 106 may be configured to provide (all) the remaining output bits corresponding to the output value 112b.

In various embodiments, the threshold level for an initial conversion cycle of the plurality of conversion cycles may be free of a predetermined redundancy level. This may mean that no redundancy level or margin is applied to the threshold level for the initial conversion cycle.

In various embodiments, the predetermined redundancy levels defining the respective threshold levels associated with the two DACs 104a, 104b for the respective conversion cycle (e.g., the predetermined conversion cycle of the at least two adjacent conversion cycles) may be of opposite signs. This may mean that the predetermined redundancy levels associated with the two DACs 104a, 104b for a respective predetermined conversion cycle may be in different directions. In this way, the predetermined redundancy levels may be addition to and subtraction from the threshold levels associated with the two DACs 104a, 104b in a conversion cycle previous to the respective predetermined conversion cycle so as to define the threshold levels associated with the two DACs 104a, 104b in the respective predetermined conversion cycle. The predetermined redundancy levels associated with the two DACs 104a, 104b in the respective predetermined conversion cycle may be of the same value.

In various embodiments, each DAC of the two DACs 104a, 104b may include at least one capacitive DAC (CDAC) arrangement connected to the respective comparator 104a, 104b, the at least one capacitive DAC arrangement having a plurality of binary-weighted capacitors.

In various embodiments, each comparator of the two comparators 102a, 102b may include a first input terminal and a second input terminal, and the at least one capacitive DAC arrangement of the respective DAC 104a, 104b may be connected to the first input terminal of the respective comparator 102a, 102b. As the at least one capacitive DAC arrangement of the respective DAC 104a, 104b may be connected to (only) one input terminal of the respective comparator 102a, 102b, a single-ended version of the respective comparator 102a, 102b may be provided. The at least one capacitive DAC arrangement for each DAC 104a, 104b may be of the same layout or configuration, for example, in terms of the values and/or arrangement and/or interconnection of the plurality of binary-weighted capacitors.

In the context of various embodiments, one of the first or second input terminal of a comparator 102a, 102b may be a non-inverting input terminal and the other of the first or second input terminal may be an inverting input terminal.

In various embodiments, each comparator of the two comparators 102a, 102b may include a first input terminal and a second input terminal, and the at least one capacitive DAC arrangement of each DAC 104a, 104b may include a first capacitive DAC arrangement having a first plurality of binary-weighted capacitors, and a second capacitive DAC arrangement having a second plurality of binary-weighted capacitors. The first capacitive DAC arrangement of the respective DAC 104a, 104b may be connected to the first input terminal of the respective comparator 102a, 102b, and the second capacitive DAC arrangement of the respective DAC 104a, 104b may be connected to the second input terminal of the respective comparator 102a, 102b. The second capacitive DAC arrangement may be used for (analog) input differential signal configuration of the ADC 100. In this way, the respective comparator 102a, 102b may be a differential comparator. The respective first capacitive DAC arrangement for each DAC 104a, 104b and/or the respective second capacitive DAC arrangement for each DAC 104a, 104b may be of the same layout or configuration, for example, in terms of the values and/or arrangement and/or interconnection of the plurality of binary-weighted capacitors. Both the first capacitive DAC arrangement and the second capacitive DAC arrangement for both DACs 104a, 104b may be of the same layout or configuration, for example, in terms of the values and/or arrangement and/or interconnection of the plurality of binary-weighted capacitors.

In various embodiments, an additional weighting capacitor may be included in each of the capacitive DAC arrangement described above. The additional weighting capacitor may be a unit capacitor.

In various embodiments, for generating the respective threshold level for the respective conversion cycle, and dependent on the output code of a preceding conversion cycle, the at least one capacitive DAC arrangement of the respective DAC 104a, 104b may be configured to selectively switch (or connect) to at least one of predetermined reference voltages—a common mode voltage (e.g., $V_{CM}$), a first reference voltage (e.g., $V_{REF_p}$) or a second reference voltage (e.g., $V_{REF_n}$). The first reference voltage and the second reference voltage may be different reference voltages, e.g., having different values and/or phases. As a non-limiting example, depending on technology, $V_{REF_p}$ may be about 1.2 V and $V_{REF_n}$ may be 0. As a further example, $V_{REF_p}$ may be about +1.2 V and $V_{REF_n}$ may be about −1.2 V, for implementation of the ADC 100 in Bipolar (or BiCMOS (combination of Bipolar and CMOS technology)) technology. The common mode voltage may be equal to half of the first reference voltage (e.g., $V_{CM}=V_{REF_p}/2$).

Figure 1B:
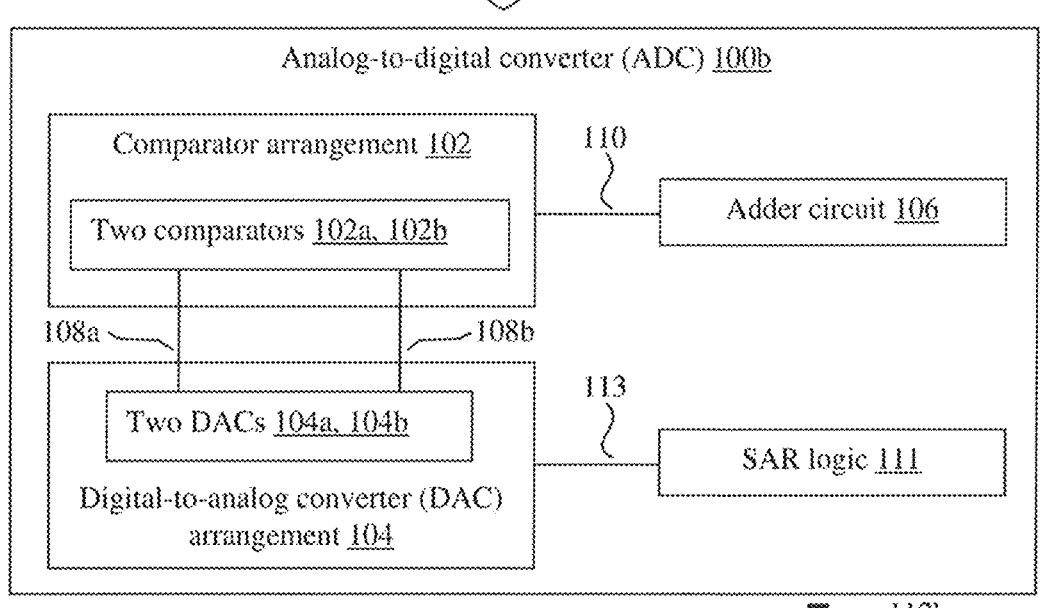
FIG. 1B shows a block diagram of an example analog-to-digital converter (ADC), according to various embodiments.

The ADC of various embodiments may include an SAR logic or circuit (which is a control logic block) which forms part of the architecture of a SAR-based converter. As a non-limiting example, as shown in FIG. 1B, the ADC 100b may include an SAR logic or circuit 111. The SAR logic 111 may be connected (as represented by line 113) to the DAC arrangement 104. The SAR logic 111 may be responsible to switch the DAC arrangement 104 such that the threshold levels or voltages for the two comparators 102a, 102b may converge to the (analog) input value 112a, so that the ADC 100 may provide an output value (e.g., digital output) 112b which is the approximated (analog) input value or signal 112a. The SAR logic 111 may include a switch controller.

In various embodiments, for generating the predetermined redundancy levels for defining the respective threshold levels associated with the two comparators 102a, 102b for the respective conversion cycle, the at least one capacitive DAC arrangement of one of the two DACs 104a, 104b may be further configured to sample a first fraction of the first reference voltage and the at least one capacitive DAC arrangement of another of the two DACs 104a, 104b may be further configured to sample a second fraction of the first reference voltage. The first fraction and the second fraction of the first reference voltage may be different fractions, e.g., having different fractional values. For example, one of the first or second fraction of the first reference voltage may be ¼ of the first reference voltage while the other of the first or second fraction of the first reference voltage may be ¾ of the first reference voltage.

In various embodiments, for generating the respective threshold levels for the respective conversion cycle, at least one binary-weighted capacitor of the plurality of binary-weighted capacitors of the respective DAC 104a, 104b may be configured to selectively switch to at least one of the predetermined reference voltages—the common mode voltage, the first reference voltage or the second reference voltage, and, for generating the predetermined redundancy levels for defining the respective threshold levels associated with the two comparators 102a, 102b for the respective conversion cycle, another binary-weighted capacitor of the plurality of binary-weighted capacitors (immediately) adjacent to and of a lower weightage than the at least one binary-weighted capacitor may be configured, for one of the two DACs 104a, 104b, to sample the first fraction of the first reference voltage, and for the other of the two DACs 104a, 104b, to sample the second fraction of the first reference voltage.

In various embodiments, for each conversion cycle starting from a third conversion cycle of the plurality of conversion cycles and ending in a final conversion cycle of the plurality of conversion cycles, the adder circuit 106 may be configurable or configured to overlap and add the first significant bit of the output code having two bits for the predetermined conversion cycle with the second significant bit of the output code having two bits for the previous conversion cycle. The adder circuit 106 may perform the overlap and adding process from the third conversion onward, for example, by overlapping and adding the first significant bit (e.g., MSB) of the 2-bit output code for the third conversion cycle with the second significant bit (e.g., LSB) of the 2-bit output code for the second conversion cycle. The term "final conversion cycle" may refer to the end conversion cycle or the last conversion cycle in time scale, e.g., cycle X of X number of cycles. As such, the last overlap and adding process to be performed by the adder circuit 106 involves overlapping and adding of the first significant bit (e.g., MSB) of the 2-bit output code in the final conversion cycle with the second significant bit (e.g., LSB) of the 2-bit output code in the conversion cycle immediately prior to the final conversion cycle.

In various embodiments, the adder circuit 106 may include a ripple carry adder circuit or a carry save adder circuit. However, it should be appreciated that other types of adder architectures may be employed.

In various embodiments, the adder circuit 106 may include a cascade array having a plurality of half adders (HA) and a plurality of full adders (FA). In various embodiments, the plurality of full adders may be sandwiched between the plurality of half adders. In various embodiments, the number of the half adders may be 2 and the number of the full adders may be 7. As a non-limiting example, such an arrangement may be implemented for a 10-bit resolution ADC of various embodiments. Nevertheless, it should be appreciated that the number of the half adders and/or the number of the full adders provided may depend on the resolution of the ADC 100.

In various embodiments, the ADC 100 may further include a sequencer configured to generate a plurality of token signals to enable generation of the respective predetermined redundancy level in response to a respective token signal of the plurality of token signals in the respective conversion cycle.

In various embodiments, the ADC 100 may further include an asynchronous clock generator configured to generate respective clock signals for enabling the two comparators over the plurality of conversion cycles. In further embodiments, it should be appreciated that a synchronous clock generator or synchronous clocking system may be used.

In various embodiments, the ADC 100 may include or may be a successive approximation register ADC (SAR ADC).

As a non-limiting example, the ADC 100 may be a 10-bit resolution ADC. Nevertheless, it should be appreciated that the ADC 100 may provide any number of bit resolution, including, more than or less than a 10-bit resolution. In various embodiments, the number of the plurality of conversion cycles may be dependent on the resolution of the ADC 100.

Figure 1C:
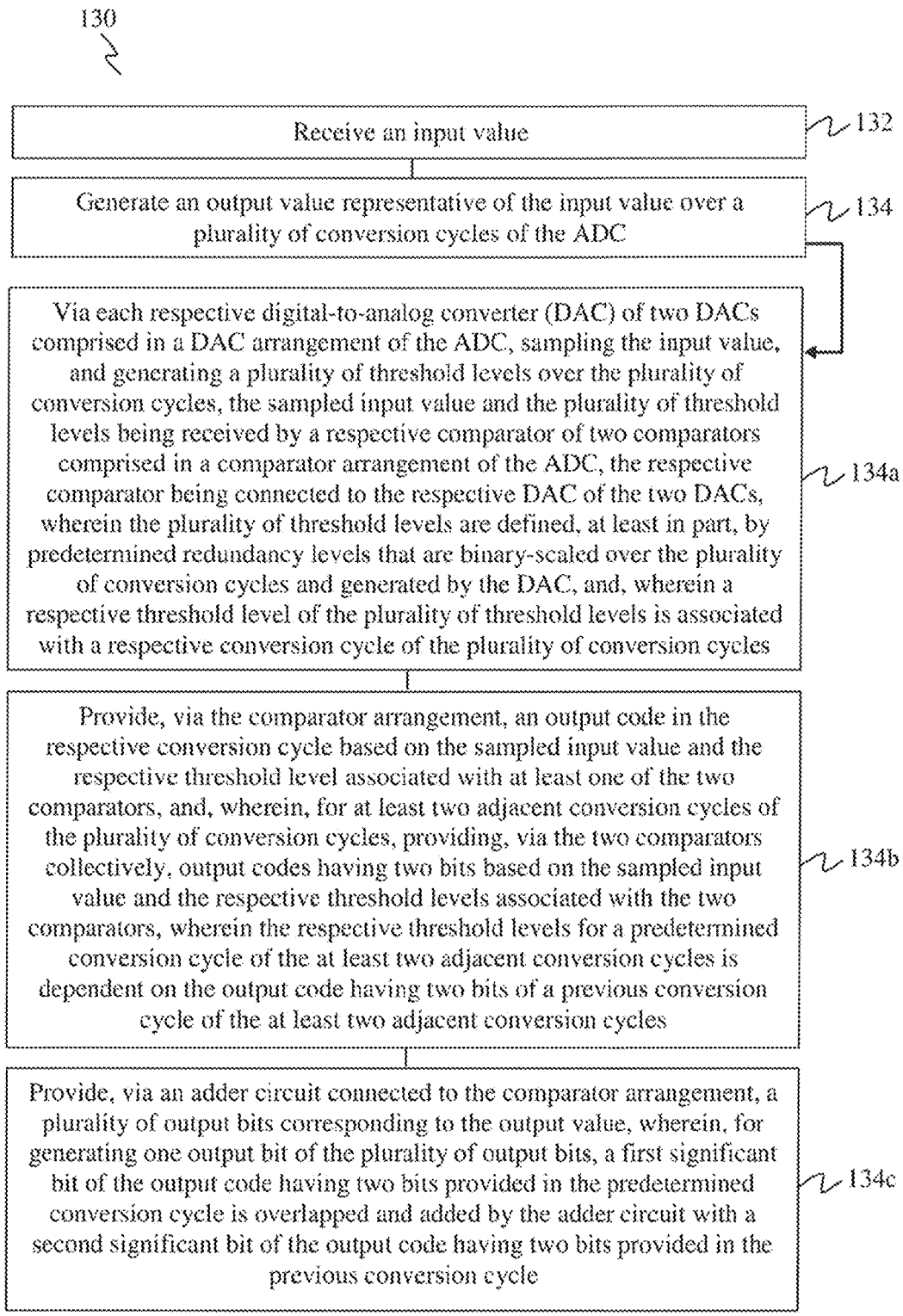
FIG. 1C shows a flow chart illustrating a method of controlling an analog-to-digital converter (ADC), according to various embodiments.

FIG. 1C shows a flow chart 130 illustrating a method of controlling an analog-to-digital converter (ADC), according to various embodiments.

At 132, an input value is received.

At 134, over a plurality of conversion cycles of the ADC, an output value representative of the input value is generated.

In various embodiments, for generating the output value at 134, the method may include the following.

At 134a, via each respective digital-to-analog converter (DAC) of two DACs included in a DAC arrangement of the ADC, the input value is sampled, and a plurality of threshold levels are generated over the plurality of conversion cycles, the sampled input value and the plurality of threshold levels being received by a respective comparator of two comparators included in a comparator arrangement of the ADC, the respective comparator being connected to the respective DAC of the two DACs. The plurality of threshold levels are defined, at least in part, by predetermined redundancy levels that are binary-scaled over the plurality of conversion cycles and generated by the DAC. A respective threshold level of the plurality of threshold levels is associated with a respective conversion cycle of the plurality of conversion cycles.

At 134b, via the comparator arrangement, an output code is provided in the respective conversion cycle based on the sampled input value and the respective threshold level associated with at least one of the two comparators, and, for at least two adjacent conversion cycles of the plurality of conversion cycles, via the two comparators collectively, output codes having two bits are provided based on the sampled input value and the respective threshold levels associated with the two comparators, wherein the respective threshold levels for a predetermined conversion cycle of the at least two adjacent conversion cycles is dependent on the output code having two bits of a previous conversion cycle of the at least two adjacent conversion cycles.

At 134c, via an adder circuit connected to the comparator arrangement, a plurality of output bits corresponding to the output value are provided, wherein, for generating one output bit of the plurality of output bits, a first significant bit of the output code having two bits provided in the predetermined conversion cycle is overlapped and added by the adder circuit with a second significant bit of the output code having two bits provided in the previous conversion cycle.

It should be appreciated that descriptions in the context of the ADC 100 may correspondingly be applicable in relation to the method of controlling an ADC in the context of the flow chart 130.

Various embodiments may provide one or more of the following features:

An asynchronous SAR ADC with 1.5 bits/cycle architecture where the first cycle may be a 1 bit/cycle in order to attain a 10-bit resolution;

A 12.5% redundancy margin may be created which relaxes the DAC settling time and provides inherent error correction capabilities which may correct up to 3 incorrect decisions. This may be achieved without taking additional cycles and zero latency;

A simple error correction algorithm utilizing only 7 full adders and 2 half adders;

100% dynamic range may be covered;

Relaxation in DAC settling time which may lead to significantly lower current consumption of the voltage reference buffer. Alternatively, the ADC's core frequency may be increased;

Redundancy margin may be traded off for capacitor mismatch which determines the linearity INL/DNL (Integral non linearity/Dynamic non linearity), therefore, the manufacturing yield;

A switching scheme in addition to VCM (common mode voltage) based switching is used to generate the redundancy margins without changing the differential DAC's common mode voltage and without using any split capacitor/additional capacitor bank. Hence, a minima in energy may be achieved.

A fixed common mode voltage preserves the offset correction done before the start of a new conversion cycle. Additionally, a fixed value of common mode for the transistor input pair of the preamplifier which may be a part of the comparator implies no change to the rms (root mean square) thermal noise due to the common mode voltage. Hence, the cycle's output would not be influenced.

It should be appreciated that various embodiments may also be used for error correction and adding redundancy to a data converter having above and below 10 bits of resolution (i.e., having more than or less than a 10-bit resolution).

The ADC architecture will now be described in further details, including the algorithm, switching principle, error correction logic, CDAC architecture and asynchronous timing generation blocks, by way of the following non-limiting examples.

Figure 2A:
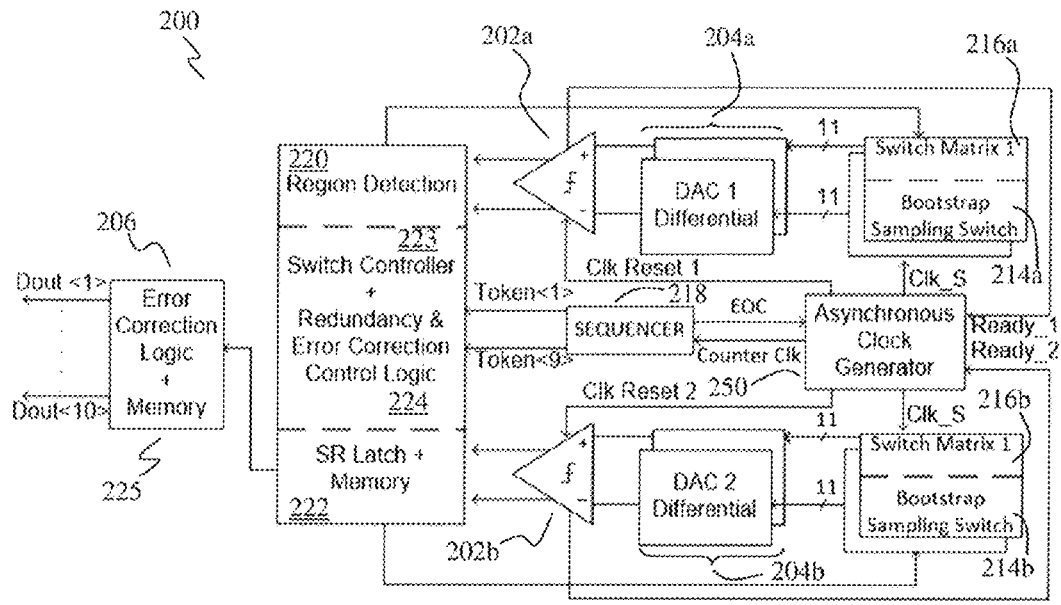
FIG. 2A shows a schematic of an analog-to-digital converter (ADC), according to various embodiments.

FIG. 2A shows a schematic of an analog-to-digital converter (ADC) 200, according to various embodiments, illustrating an example of an architecture of an asynchronous successive approximation register analog-to-digital converter (SAR ADC) with digital error correction. The analog-to-digital converter (ADC) 200 may be a 10-bit SAR ADC with redundancy and real time error correction. The ADC 200 is a non-limiting example of an implementation of the redundancy and error correction scheme for a 10-bit SAR ADC.

The SAR ADC architecture 200 includes several circuit blocks such as two comparators 202a, 202b, an asynchronous clock generator 250, one or more bootstrap sampling switches 214a, 214b, one or more switch matrix 216a, 216b, two capacitive digital-to-analog converter (CDACs) 204a, 204b (in the form of a differential DAC for each CDAC 204a, 204b), a sequencer 218, a static preamplifier, an N-type input pair dynamic sense-amp latch, a region detection logic 220, a set-reset (SR) latch with memory 222, a switch control logic 223, a redundancy and error correction logic 224, and an error correction logic (e.g., adder circuit) 206 plus memory 225.

The static preamplifier may be a part of a respective comparator 202a, 202b and may be treated as a first gain stage of the comparator 202a, 202b, providing a first gain, A1. The static preamplifier is a gain circuit which may amplify the differential voltage available from the differential CDAC 204a, 204b. The N-type input pair dynamic sense-amp latch may be a part of a respective comparator 202a, 202b and may be treated as a second gain stage of the comparator 202a, 202b, providing a second gain, A2. The output of the preamplifier may be connected to the N-type sense amp latch, which may be a high gain circuit, to convert the small differential voltage from the pre-amp output to full swing, e.g., supply voltage of the N-type sense amp (VDD of the comparator 202a, 202b) The total gain of the respective comparator 202a, 202b may be, $|A_T|=A1*A2$.

The bootstrap sampling switches 214a, 214b may sample an (analog) input voltage (e.g., 112a, FIG. 1A; not shown in FIG. 2A) onto the bottom plate of the capacitive DACs 204a, 204b. The main purpose of this is to avoid any input dependent charge injection onto the capacitive DACs 204a, 204b and enhance the linearity of the CMOS switch 216a, 216b. The switch matrix 216a, 216b may include CMOS transistors connecting the analog input voltage, and reference voltages to the capacitive DAC 204a, 204b with the help of control signals generated by the switch controller 223 and/or the asynchronous clock generator 250 and/or the sequencer 218. The SR latch 222 may hold the comparator output for the entire conversion cycle (e.g., conversion cycle 1) such that the memory element/circuit 222 may store the result from the comparator 202a, 202b.

In terms of operation, an input signal (or input value) may be bottom plate sampled by the bootstrap switch 214a, 214b, during the sampling phase onto the differential CDAC 204a, 204b, to obtain linearity equivalent to 10 bits. A constant common mode fractional reference voltage switching scheme (CCM-FRVSS) may be used to generate two comparator thresholds required for 1.5 bits/cycle conversion. The dual comparators 202a, 202b and DACs 204a, 204b may be used to generate the comparator threshold 1 and comparator threshold 2 for comparison of the analog input value. An event driven asynchronous clock generation circuit 250 based on comparators ready signal (Ready_1, Ready_2) may be used to generate high frequency internal clocks such as comparator clocks (Clk Reset 1, Clk Reset 2). The output(s) of the comparators 202a, 202b may be converted from thermometer (code) to binary (code) before storing in the memory 222 preceding the error correction logic 206.

A sequencer 218 may be used to selectively activate parts of the control logic and activate cycle wise redundancy 223, 224, via a token generation system; this reduces static current. The function of the sequencer 218 in the example implementation illustrated in FIG. 2A is to receive the signal "Counter Clk" generated by the asynchronous clock generator 250 and generate conversion cycle specific Tokens, for example, Token 1, Token 2, etc. These conversion cycle specific Tokens may then be fed to the switch controller 223 which is responsible to enable specific CMOS switches to connect, for example, a first fraction of a first reference voltage and a second fraction of the first reference voltage to the respective DACs 204a, 204b in order to generate the predetermined redundancy levels. Upon completion of the conversion cycle, error correction may be performed (by the error correction logic 206) and the output may be available in the memory 225 at the falling edge of the sampling clock (Clk_S).

Figure 2B:
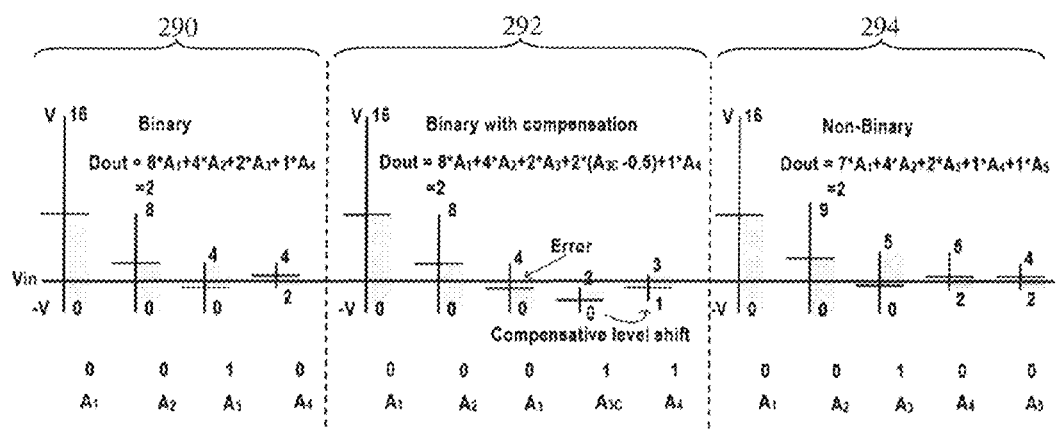
FIG. 2B shows examples of known successive approximation register (SAR) algorithms and their implementation. The examples in FIG. 2B show the digital conversion of a normalized input value of 2 mV with respect to a reference voltage ($Vref_p$).

There are a few methods that may be implemented for a successive approximation ADC to converge to the analog input value. FIG. 2B shows examples of known SAR algorithms and their implementation. FIG. 2B shows an example 290 for a known binary scaled algorithm without redundancy, an example 292 for a binary scaled with compensation based SAR requiring additional compensation DAC capacitors, and an example 294 for a non-binary scaled redundancy where the radix, for example, is 1.85 instead of 2. The total bit cycles, based on the implementations illustrated in schematics 290, 292, 294, required for a 10 bits resolution ADC is 10, 13 and 13 respectively with similar redundancy margins, for example, 12.5% for the SAR algorithms represented in schematics 292, 294. The extra bit cycles output is converted to the required resolution using large and complex arithmetic units.

The binary scaled redundancy algorithm and switching scheme (CCM-FRVSS) of various embodiments will now be described below.

Figure 2C:
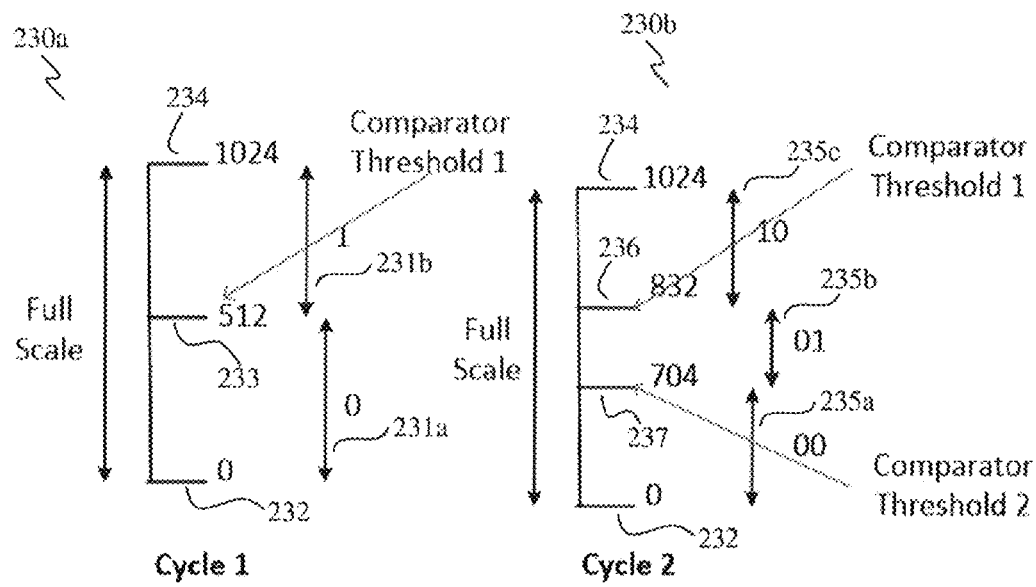
FIG. 2C shows an example implementation for decision regions in different conversion cycles of the binary scaled redundancy scheme of various embodiments.

FIG. 2C shows example implementations 230a, 230b for decision regions in different conversion cycles of the binary scaled redundancy scheme of various embodiments, illustrating the decision regions in conversion cycle 1 (schematic 230a) and conversion cycle 2 (schematic 230b) of the binary scaled redundancy scheme. FIG. 2C shows an embodiment of an implementation for the ADC or data converter of various embodiments where conversion cycle 1 may be a 1 bit/cycle and conversion cycle 2 (and also the remaining cycles, e.g., remaining 8 cycles) may be a 1.5 bits/cycle. The threshold generation for conversion cycle 1 and conversion cycle 2 and the 1.5 bits/cycle concept are illustrated in FIG. 2C.

The conversion after sampling the input analog voltage begins with a first conversion cycle, where for the first conversion cycle, comparator 1 (e.g., 202a, FIG. 2A) may be enabled and two decision regions may be generated. The decision regions include decision region "0" 231a defined between a minimum value (e.g., "0") 232 of a full scale of values and a comparator threshold 1 (e.g., "512" for a 10 bits resolution data converter) 233 associated with comparator 1, and decision region "1" 231b defined between the comparator threshold 1 233 and a maximum value (e.g., "1024") 234 of the full scale of values.

After the first conversion cycle, one or more conversion cycles of 1.5 bits/cycle may be implemented by using 2 comparators (e.g., 202a, 202b, FIG. 2A) implementing 3 decision regions "00" 235a, "01" 235b, and "10" 235c. Two different thresholds, comparator threshold 1 (e.g., "832") 236 and comparator threshold 2 (e.g., "704") 237, may be generated with the help of dual differential DACs (e.g., 204a, 204b, FIG. 2A). The decision region "00" 235a is defined between the minimum value 232 and the comparator threshold 2 237, the decision region "01" 235b is defined between the comparator threshold 2 237 and the comparator threshold 1 236, and the decision region "10" 235c is defined between the maximum value 234 and the comparator threshold 1 236.

In various embodiments, the 3 decision regions "00" 235a, "01" 235b, and "10" 235c implemented from conversion cycle 2 onwards may be asymmetric and of unequal size.

Figure 2D:
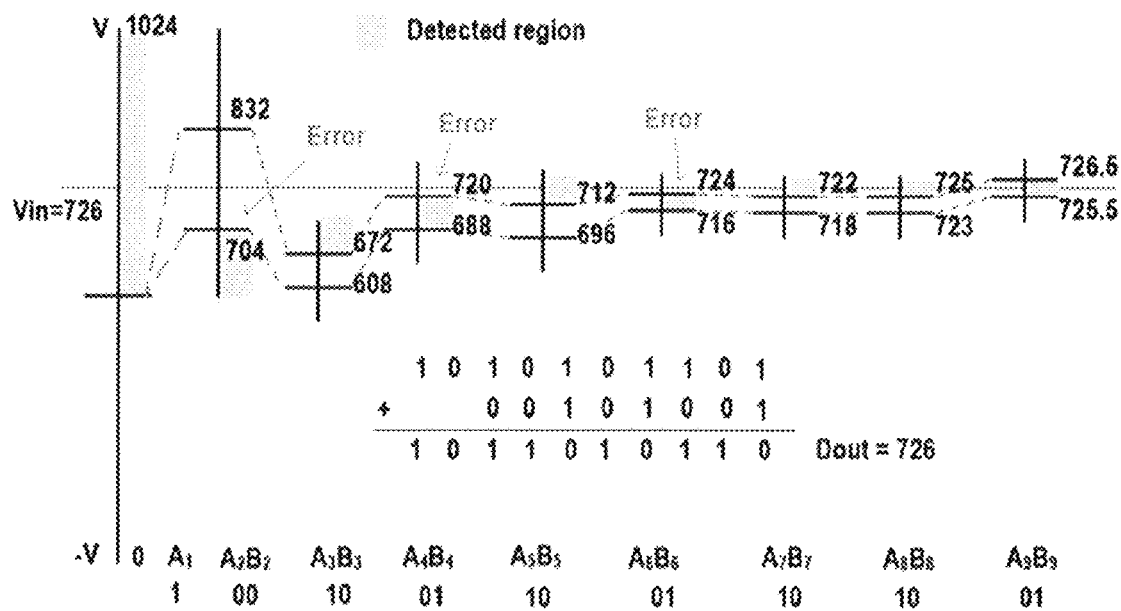
FIG. 2D shows an example implementation of a binary scaled redundancy-facilitated error correction logic, according to various embodiments. The example in FIG. 2D shows the digital conversion of a normalized input value of 726 mV with respect to a reference voltage ($V_{REF_p}$).
Figure 6:
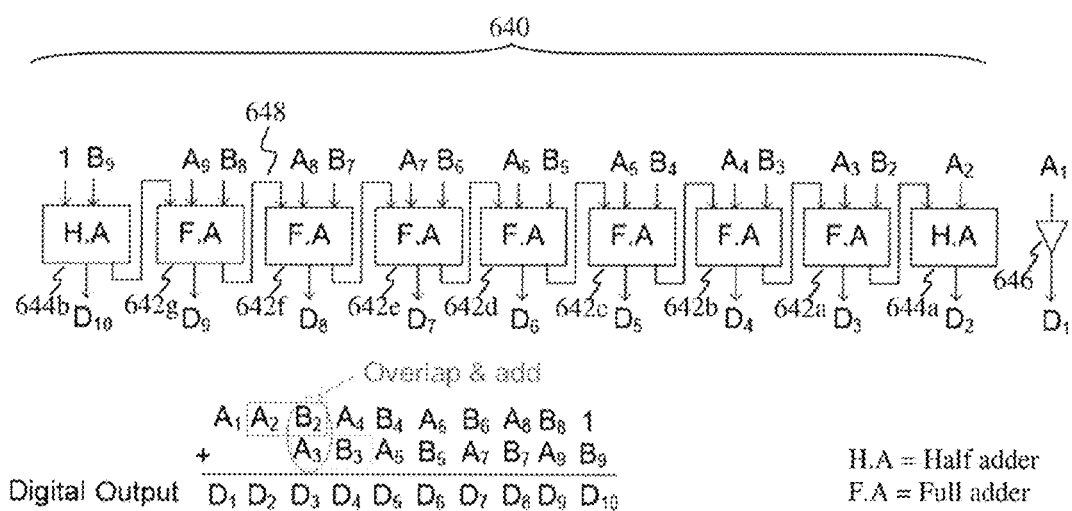
FIG. 6 shows a schematic of an error correction circuit, according to various embodiments.

FIG. 2D shows an example implementation of a binary scaled redundancy-facilitated error correction logic, according to various embodiments, illustrating a non-limiting example of the binary scaled redundancy-facilitated error correction algorithm. As shown, the first conversion cycle is a 1 bit conversion followed by 8 bit cycles of 1.5 bits conversion. This may correct up to 3 erroneous decision without any additional bit cycles. A simple overlap and addition (only) adder circuit (or error correction logic), as will be described later below (see, for example, FIG. 6 illustrating an overlap and add (only) digital logic), may be used to obtain the desired 10 bits digital output. As shown in FIG. 2D, from conversion cycle 3 onwards, the least significant bit (LSB) of the previous bit conversion cycle output may be overlapped and added to the most significant bit (MSB) of the current bit conversion cycle output.

Figure 3A:
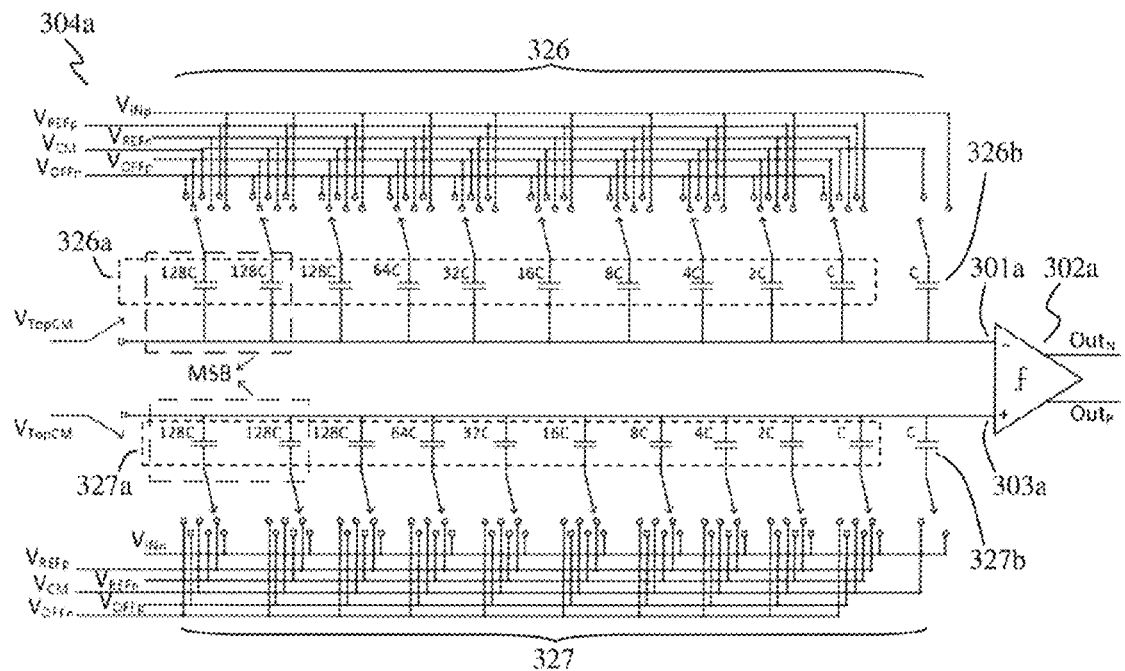
FIGS. 3A and 3B show schematics of respective charge redistribution digital-to-analog converter (DAC) and comparator of the analog-to-digital converter (ADC) of various embodiments.
Figure 3B:
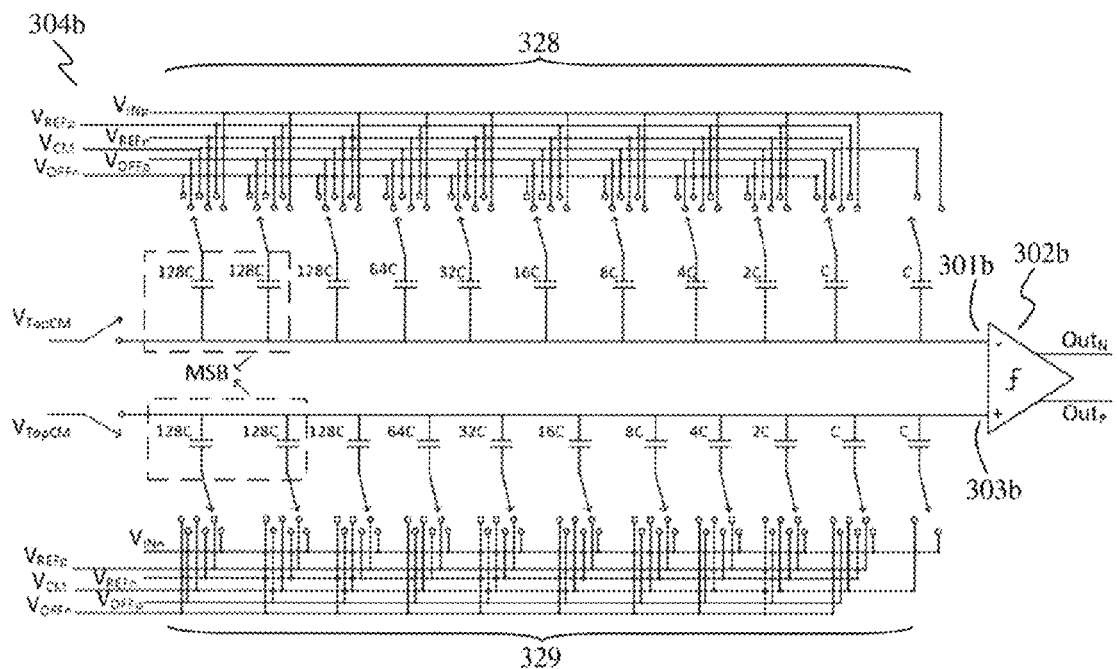

The conversion or algorithm for generation of comparator threshold for each conversion cycle may be described with reference to FIGS. 3A and 3B. FIGS. 3A and 3B show schematics of respective charge redistribution digital-to-analog converters (DACs) 304a, 304b and comparators 302a, 302b of the analog-to-digital converter (ADC) (e.g., 200, FIG. 2A) of various embodiments. FIGS. 3A and 3B may be examples for a 10-Bit 1.5 bits/cycle SAR ADC with redundancy and real time error correction. As shown in FIGS. 3A and 3B, the DACs 304a, 304b may be differential DACs.

The DACs 304a, 304b may be capacitive DACs (CDACs). The DAC 304a may include a first capacitive DAC arrangement 326 and a second capacitive DAC arrangement 327 respectively connected to an inverting input terminal (− terminal) 301a and a non-inverting input terminal (+ terminal) 303a of the comparator 302a. The DAC 304b may include a first capacitive DAC arrangement 328 and a second capacitive DAC arrangement 329 respectively connected to an inverting input terminal (− terminal) 301b and a non-inverting input terminal (+ terminal) 303b of the comparator 302b.

The DACs 304a, 304b may be identical to one another or may have a similar layout. Using the DAC 304a as an example, the first capacitive DAC arrangement 326 may include a first plurality of binary-weighted capacitors 326a. An additional first weighting capacitor (e.g., a unit capacitor) 326b may be included in the first capacitive DAC arrangement 326. The second capacitive DAC arrangement 327 may include a second plurality of binary-weighted capacitors 327a. An additional second weighting capacitor (e.g., a unit capacitor) 327b may be included in the second capacitive DAC arrangement 327.

As shown in FIGS. 3A and 3B, each of the first plurality of binary-weighted capacitors 326a, the additional first weighting capacitor 326b, the second plurality of binary-weighted capacitors 327a, and the additional second weighting capacitor 327b may be selectively switched to one of a plurality of voltages, for example, at a bottom plate of each of the capacitors. The plurality of voltages may include an input value or input voltage ($V_{IN_p}$ and $V_{IN_n}$, which are phase shifted relative to one another, for example, by 180°), a first reference voltage (e.g., $V_{REF_p}$), a second reference voltage (e.g., $V_{REF_n}$), a common mode voltage ($V_{CM}$) which may be equal to half of the first reference voltage (e.g., ½ $V_{REF_p}$), a first offset voltage ($V_{OFF_p}$) which may be equal to three quarter of the first reference voltage (e.g., ¾ $V_{REF_p}$) and a second offset voltage ($V_{OFF_n}$) which may be equal to one quarter of the first reference voltage (e.g., ¼ $V_{REF_p}$).

In the following descriptions, the first capacitive DAC arrangement 326, 328 connected to the respective inverting input terminal 301a, 301b may be referred to as a negative DAC, while the second capacitive DAC arrangement 327, 329 connected to the respective non-inverting input terminal 303a, 303b may be referred to as a positive DAC. It should be appreciated that the DAC 304a of FIG. 3A may be the DAC 204a (FIG. 2A) and may be referred to as a top DAC, while the DAC 304b of FIG. 3B may be the DAC 204b (FIG. 2A) and may be referred to as a bottom DAC.

The conversion or algorithm may begin with bottom plate sampling of the analog input value based on charge redistribution principle. For example, the positive DAC 327, 329 samples $V_{IN_n}$ and the negative DAC 326, 328 samples $V_{IN_p}$, where $V_{IN_p}$ is the input positive voltage and $V_{IN_n}$ is the input negative voltage. After which, the capacitive DAC bottom plate may be switched to the common mode voltage, $V_{CM}$, that is equal to $V_{REF_p}/2$. This step divides the $2^{10}$ (=1024) full scale for a 10 bits converter into 2 regions, namely region 0 and region 1 (see FIG. 2C).

After the voltage $V_{CM}$ settles, only comparator 1 302a is turned on. Based on the output of the comparator 1, the DAC 304a may be switched as follows:

| Comparator 1 output = | 0 | Positive DAC | Cap(cycle) | Switched → | $V_{REFp}$ |
|---|---|---|---|---|---|
| | | Negative DAC | Cap(cycle) | Switched → | $V_{REFn}$ |
| | 1 | Positive DAC | Cap(cycle) | Switched → | $V_{REFn}$ |
| | | Negavtive DAC | Cap(cycle) | Switched → | $V_{REFp}$ |

Where cycle = 1

Depending on the conversion cycle 1's output, the second differential DAC 304b may also be switched in a similar manner as the first differential DAC 304a to prepare for 1.5 bits/cycle conversion.

The redundancy level or margin created in the first and second DACs 304a, 304b are in different directions, hence creating two different comparator thresholds (e.g., 236, 237, FIG. 2C) from conversion cycle 2 onwards. The redundancy margins may be created as follows:

| Top DAC Redundancy = | Positive DAC | Cap(cycle) | Switched → | $V_{OFFn}$ |
|---|---|---|---|---|
| | Negative DAC | Cap(cycle) | Switched → | $V_{OFFp}$ |
| Bot DAC Redundancy = | Positive DAC | Cap(cycle) | Switched → | $V_{OFFp}$ |
| | Negative DAC | Cap(cycle) | Switched → | $V_{OFFn}$ |

Where cycle = 2, 3, ..., 9, where $V_{OFF_n} = ¼ V_{REF_p}$, and $V_{OFF_p} = ¾ V_{REF_p}$.

From conversion cycle 2 onwards, both comparators 302a, 302b are turned on. The thermometer coded output is converted to binary, hence possible comparator outputs (or decision regions) may be 00, 01, 10 (e.g., 235a, 235b, 235c, FIG. 2C). The top differential DAC 304a and the bottom differential DAC 304a may be switched as follows:

| Comparators output = | 00 | Positive DAC | Cap(cycle) | Switched → | $V_{REFp}$ |
|---|---|---|---|---|---|
| | | Negative DAC | Cap(cycle) | Switched → | $V_{REFn}$ |
| | 00 | Positive DAC | Cap(cycle) | Switched → | $V_{REFp}$ |
| | | Negavtive DAC | Cap(cycle) | Switched → | $V_{REFn}$ |
| Comparators output = | 01 | Positive DAC | Cap(cycle) | Switched → | $V_{CM}$ |
| | | Negative DAC | Cap(cycle) | Switched → | $V_{CM}$ |
| | 01 | Positive DAC | Cap(cycle) | Switched → | $V_{CM}$ |
| | | Negavtive DAC | Cap(cycle) | Switched → | $V_{CM}$ |

-continued

| Comparators output = | 10 | Positive DAC | Cap(cycle) | Switched → | $V_{REFn}$ |
| --- | --- | --- | --- | --- | --- |
| | | Negative DAC | Cap(cycle) | Switched → | $V_{REFp}$ |
| | 10 | Positive DAC | Cap(cycle) | Switched → | $V_{REFn}$ |
| | | Negavtive DAC | Cap(cycle) | Switched → | $V_{REFp}$ |

Where cycle = 2, . . . ,9

Irrespective of the comparator output, the redundancy margins are fixed and may switch the DAC 304a, 304b accordingly as described above. The predetermined redundancy levels or the redundancy margins may be as shown in Table 1.

TABLE 1

Non-limiting examples of redundancy added in each cycle for a 1.5 bits/cycle implementation of various embodiments.

| Cycle | Amount of redundancy |
| --- | --- |
| 1 | 0 |
| 2 | 64 |

TABLE 1-continued

Non-limiting examples of redundancy added in each cycle for a 1.5 bits/cycle implementation of various embodiments.

| Cycle | Amount of redundancy |
| --- | --- |
| 3 | 32 |
| 4 | 16 |
| 5 | 8 |
| 6 | 4 |
| 7 | 2 |
| 8 | 1 |
| 9 | 0.5 |

The conversion or algorithm may also be as shown in Tables 2 and 3 below, which summarise the DAC switching including generating the cycle wise redundancy, based on the output of the comparator 302a or both comparators 302a, 302b. The binary weighted capacitors (e.g., 326a, 327a, FIG. 3A) in the DACs 304a, 304b are connected to one of the following voltages $-V_{CM}(1)$, $V_{REF_p}(2)$, $V_{REF_n}(3)$, $V_{OFF_p}(4)$, $V_{OFF_n}(5)$ respectively, where $V_{OFF_n}=\frac{1}{4} V_{REF_p}$; $V_{OFF_p}=\frac{3}{4} V_{REF_p}$, with the numbers indicated in Tables 2 and 3 representing the corresponding voltages as described above. For example, for CDAC1, in Cycle 1 if the comparator 302a output is logic 0, then the $256C_U$ capacitor is switched or connected to $V_{REF_p}(2)$ and a redundancy margin is created by connecting the next capacitor, i.e. $128C_U$, in the binary scaled array to $V_{OFF_n}(5)$.

TABLE 2

Non-limiting examples of the reference voltages connected to the binary weighted CDAC 1 (e.g., 304a, FIG. 3A) to implement the binary scaled redundancy-facilitated error correction algorithm of various embodiments.

| CDAC 1 (Positive) Sampling | $2^{N-2}$ $256C_U$ $V_{IN}$ | $2^{N-3}$ $128C_U$ $V_{IN}$ | $2^{N-4}$ $64C_U$ $V_{IN}$ | $2^{N-5}$ $32C_U$ $V_{IN}$ | $2^{N-6}$ $16C_U$ $V_{IN}$ | $2^{N-7}$ $8C_U$ $V_{IN}$ | $2^{N-8}$ $4C_U$ $V_{IN}$ | $2^{N-9}$ $2C_U$ $V_{IN}$ | $2^{N-10}$ $C_U$ $V_{IN}$ | $2^0$ $C_U$ $V_{IN}$ |
| --- | --- | --- | --- | --- | --- | --- | --- | --- | --- | --- |
| Cycle 1 | 1 | 1 | 1 | 1 | 1 | 1 | 1 | 1 | 1 | 1 |
| Cycle 2 | 2; 3 | 5 | 1 | 1 | 1 | 1 | 1 | 1 | 1 | 1 |
| Cycle 3 | 2; 3 | 2; 1; 3 | 5 | 1 | 1 | 1 | 1 | 1 | 1 | 1 |
| Cycle 4 | 2; 3 | 2; 1; 3 | 2; 1; 3 | 5 | 1 | 1 | 1 | 1 | 1 | 1 |
| Cycle 5 | 2; 3 | 2; 1; 3 | 2; 1; 3 | 2; 1; 3 | 5 | 1 | 1 | 1 | 1 | 1 |
| Cycle 6 | 2; 3 | 2; 1; 3 | 2; 1; 3 | 2; 1; 3 | 2; 1; 3 | 5 | 1 | 1 | 1 | 1 |
| Cycle 7 | 2; 3 | 2; 1; 3 | 2; 1; 3 | 2; 1; 3 | 2; 1; 3 | 2; 1; 3 | 5 | 1 | 1 | 1 |
| Cycle 8 | 2; 3 | 2; 1; 3 | 2; 1; 3 | 2; 1; 3 | 2; 1; 3 | 2; 1; 3 | 2; 1; 3 | 5 | 1 | 1 |
| Cycle 9 | 2; 3 | 2; 1; 3 | 2; 1; 3 | 2; 1; 3 | 2; 1; 3 | 2; 1; 3 | 2; 1; 3 | 2; 1; 3 | 5 | 1 |
| Comparator Output | 0; 1 10 | 00; 01; 10 | 00; 01; 10 | 00; 01; 10 | 00; 01; 10 | 00; 01; 10 | 00; 01; 10 | 00; 01; 10 | 00; 01; 10 | |

TABLE 3

Non-limiting examples of the reference voltages connected to the binary weighted CDAC 2 (e.g., 304a, FIG. 3A) to implement the binary scaled redundancy-facilitated error correction algorithm of various embodiments.

| CDAC 2 (Positive) Sampling | $2^{N-2}$ $256C_U$ $V_{IN}$ | $2^{N-3}$ $128C_U$ $V_{IN}$ | $2^{N-4}$ $64C_U$ $V_{IN}$ | $2^{N-5}$ $32C_U$ $V_{IN}$ | $2^{N-6}$ $16C_U$ $V_{IN}$ | $2^{N-7}$ $8C_U$ $V_{IN}$ | $2^{N-8}$ $4C_U$ $V_{IN}$ | $2^{N-9}$ $2C_U$ $V_{IN}$ | $2^{N-10}$ $C_U$ $V_{IN}$ | $2^0$ $C_U$ $V_{IN}$ |
| --- | --- | --- | --- | --- | --- | --- | --- | --- | --- | --- |
| Cycle 1 | 1 | 1 | 1 | 1 | 1 | 1 | 1 | 1 | 1 | 1 |
| Cycle 2 | 2; 3 | 4 | 1 | 1 | 1 | 1 | 1 | 1 | 1 | 1 |
| Cycle 3 | 2; 3 | 2; 1; 3 | 4 | 1 | 1 | 1 | 1 | 1 | 1 | 1 |
| Cycle 4 | 2; 3 | 2; 1; 3 | 2; 1; 3 | 4 | 1 | 1 | 1 | 1 | 1 | 1 |
| Cycle 5 | 2; 3 | 2; 1; 3 | 2; 1; 3 | 2; 1; 3 | 4 | 1 | 1 | 1 | 1 | 1 |
| Cycle 6 | 2; 3 | 2; 1; 3 | 2; 1; 3 | 2; 1; 3 | 2; 1; 3 | 4 | 1 | 1 | 1 | 1 |
| Cycle 7 | 2; 3 | 2; 1; 3 | 2; 1; 3 | 2; 1; 3 | 2; 1; 3 | 2; 1; 3 | 4 | 1 | 1 | 1 |

TABLE 3-continued

Non-limiting examples of the reference voltages connected to the
binary weighted CDAC 2 (e.g., 304a, FIG. 3A) to implement the binary scaled
redundancy-facilitated error correction algorithm of various embodiments.

| CDAC 2 | $2^{N-2}$ | $2^{N-3}$ | $2^{N-4}$ | $2^{N-5}$ | $2^{N-6}$ | $2^{N-7}$ | $2^{N-8}$ | $2^{N-9}$ | $2^{N-10}$ | $2^0$ |
|---|---|---|---|---|---|---|---|---|---|---|
| (Positive) | $256C_U$ | $128C_U$ | $64C_U$ | $32C_U$ | $16C_U$ | $8C_U$ | $4C_U$ | $2C_U$ | $C_U$ | $C_U$ |
| Sampling | $V_{IN}$ | $V_{IN}$ | $V_{IN}$ | $V_{IN}$ | $V_{IN}$ | $V_{IN}$ | $V_{IN}$ | $V_{IN}$ | $V_{IN}$ | $V_{IN}$ |
| Cycle 8 | 2; 3 | 2; 1; 3 | 2; 1; 3 | 2; 1; 3 | 2; 1; 3 | 2; 1; 3 | 2; 1; 3 | 4 | 1 | 1 |
| Cycle 9 | 2; 3 | 2; 1; 3 | 2; 1; 3 | 2; 1; 3 | 2; 1; 3 | 2; 1; 3 | 2; 1; 3 | 2; 1; 3 | 4 | 1 |
| Comparator Output | 0; 1 | 00; 01; 10 | 00; 01; 10 | 00; 01; 10 | 00; 01; 10 | 00; 01; 10 | 00; 01; 10 | 00; 01; 10 | 00; 01; 10 | 00; 01; 10 |

"$Out_N$" and "$Out_P$" shown in FIGS. 3A and 3B refer to the differential outputs of the comparators 302a, 302b. If $Out_P$ is logic 0, then $Out_N$ is logic 1, and vice versa. In various embodiments, the analog-to-digital converter (ADC) or data converter may be implemented in a differential configuration and, therefore, one or more differential output comparator 302a, 302b may be provided, as shown in FIGS. 3A and 3B as non-limiting examples. In further embodiments, one or more single ended output comparators may be implemented.

The use of redundancy may be optimized by using no redundancy for bit conversion cycle 1 (i.e., conversion cycle 1 is free of redundancy margin) as the switching scheme may provide sufficient time for the $V_{CM}$ reference voltage to settle and any noise on the $V_{CM}$ reference voltage may be cancelled out due to the differential arrangement of CDACs. Depending on conversion cycle 1's output, the second differential DAC (e.g., 304b, FIG. 3B) is also switched in a similar manner as the first differential DAC (e.g., 304a, FIG. 3A) to prepare for 1.5 bits/cycle conversion. The redundancy margins created in the first and second DACs 304a, 304b are in different directions, hence creating two different comparator thresholds from conversion cycle 2 onwards.

As also described above, from conversion cycle 2 onwards, both comparators (e.g., 302a, FIG. 3A; 302b, FIG. 3B) are turned on. The thermometer coded output is converted to binary; hence possible comparator outputs (or decision regions) may be 00, 01, 10. Irrespective of the comparator output, the redundancy margins are fixed and switch the DAC accordingly. $T=\tau \times \ln(\frac{1}{2} \times \frac{1}{2}N)$ is the time required for an N bit DAC to settle within the precision of ½ LSB without redundancy. Hence $7.625\tau$ is required. Whereas, with redundancy for 2nd conversion cycle, $T=\tau \times \ln(32 \times \frac{1}{2}^{10})$ is required for the DAC to settle within a precision of 32 LSBs. Hence $3.466\tau$ is required if the approach of various embodiments is utilized. A massive saving of $4.159\tau$ is achieved which may be translated in either increasing the cycle frequency, enabling faster conversion, or relaxing the power consumption of the reference buffer.

FIGS. 4A to 4D show schematics illustrating the charge redistribution principle based constant common mode fractional reference voltage switching scheme (CCM-FRVSS) procedure, according to various embodiments, illustrating the procedure for two CDACs, CDAC1 304a and CDAC2 304b. FIGS. 4A to 4D show schematics of a single ended version of the fractional reference voltage switching procedure used to generate 12.5% redundancy margins, according to various embodiments. For simplicity, a single ended version of the switching scheme is shown, but it should be appreciated that the CCM-FRVSS is applicable to both of the capacitive DAC arrangements defining the differential arrangement of the CDAC.

As shown in FIG. 4A, the respective bottom plate of the CDAC1 304a and CDAC2 304b is selectively switched for input voltage sampling. After the bottom plate input voltage sampling, $V_{CM}$ may be connected to the bottom plate of the CDACs 304a, 304b, as shown in FIG. 4B, after which the conversion begins and a decision is made by activating comparator 1 (e.g., 302a, FIG. 3A) with clock_1 signal (see FIG. 2A). In FIG. 4B, one comparator threshold level 433 is shown.

Depending on the previous bit conversion cycle's output, the binary-weighted capacitors of the CDACs 304a, 304b for the current conversion cycle may be connected to $V_{REF_p}$ or $V_{REF_n}$ or $V_{CM}$, as shown in FIGS. 4C and 4D. A bit cycle dependent, [0, 64, 32, 16, 8, 4, 2, 1, 0.5] LSB redundancy margin to facilitate error correction may be created by switching the dual CDAC's next binary-weighted capacitor (e.g., the next capacitor adjacent to and of a lower weightage than the one or more binary-weighted capacitors switched to be connected to $V_{REF_p}$ or $V_{REF_n}$ or $V_{CM}$) to either $V_{OFFSET_p}$ (e.g., equal to $\frac{3}{4}V_{REF_p}$) or $V_{OFFSET_n}$ (e.g., equal to $\frac{1}{4}V_{REF_p}$) which serve as fractional reference voltages. This may reduce the energy consumption of the switching scheme of various embodiments. In FIGS. 4C and 4D, two comparator threshold levels 436c, 437c, 436d, 437d are shown.

Figure 4E:
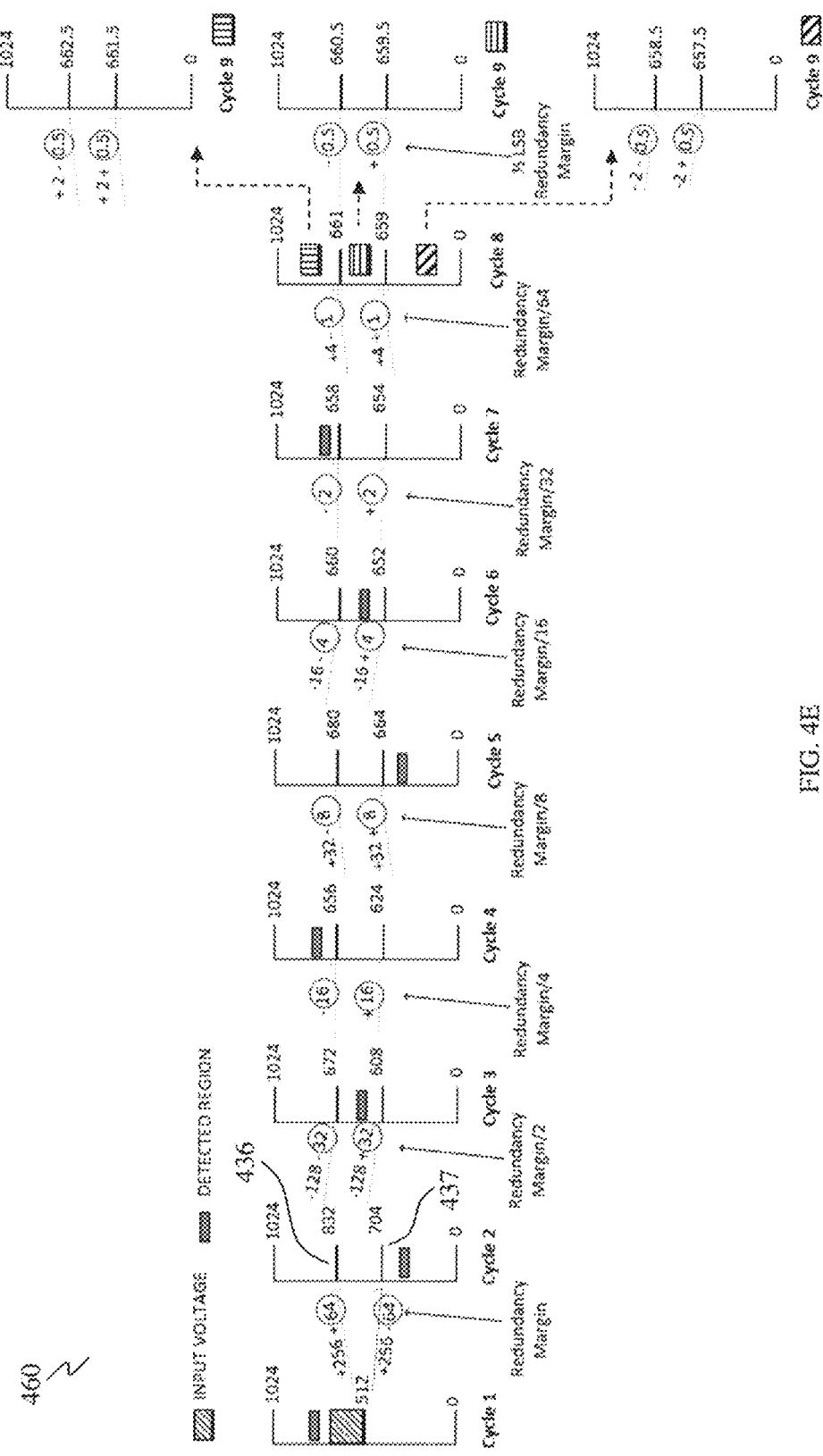
FIG. 4E shows a schematic of an implementation of a 12.5% redundancy scheme of various embodiments for an analog-to-digital converter (ADC), according to various embodiments.

FIG. 4E shows a schematic 460 of an implementation of a 12.5% redundancy scheme of various embodiments for an analog-to-digital converter (ADC) (e.g., successive approximation analog-to-digital converter (SAR ADC)), according to various embodiments, illustrating a non-limiting example of the conversion or algorithm of various embodiments. The conversion for a typical analog input value is illustrated in FIG. 4E. After completion of conversion cycle 1, an offset of 64-LSB is added via DAC switching. In successive conversion cycles, this offset is reduced by subtracting and adding half of the redundancy margin to the upper comparator threshold 1 (e.g., 436 indicated for conversion cycle 2) and lower comparator threshold 2 (e.g., 437 indicated for conversion cycle 2) respectively.

Using conversion cycles 2-5 as an example, as the detected region falls within the decision region "00" for conversion cycle 2, in addition to the binary-scaled predetermined redundancy levels "±32", both (comparator) threshold levels 436, 437 are also subtracted by binary-scaled values "128" to prepare for conversion cycle 3. As the detected region falls within the decision region "01" for conversion cycle 3, the threshold levels for conversion cycle 3 are just adjusted by the binary-scaled predetermined redundancy levels "±16" to prepare for conversion cycle 4. As the detected region falls within the decision region "10" for conversion cycle 4, in addition to the binary-scaled predetermined redundancy levels "±8", both threshold levels are also added with binary-scaled values "32" to prepare for conversion cycle 5. As the conversion cycle progresses, the threshold levels generated converge to the normalised (analog) input voltage value.

Figure 5A:
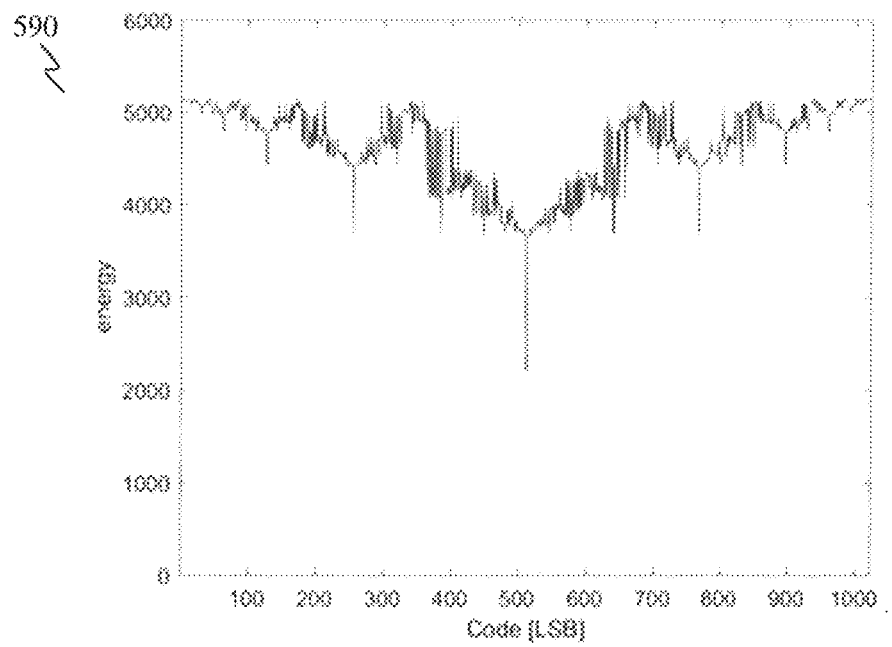
Figure 5B:
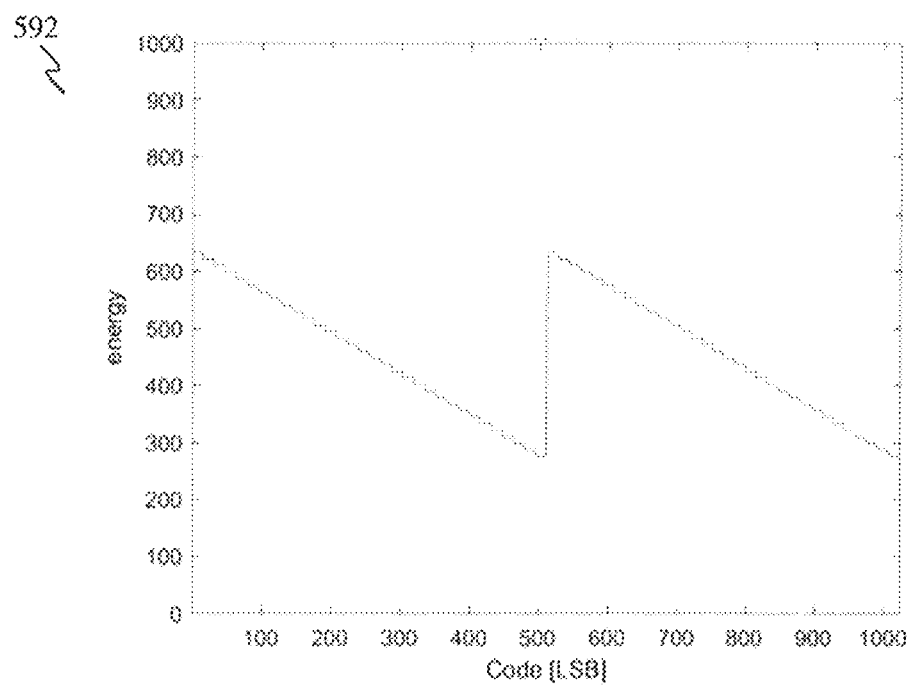
FIG. 5B shows a plot of energy consumption for the switching scheme of various embodiments implementing 1.5 bits/cycle.

FIG. 5A shows a plot 590 of energy consumption for a known switching scheme implementing 1.5 bits/cycle, while FIG. 5B shows a plot 592 of energy consumption for the switching scheme (i.e., CCM-FRVSS) of various embodiments implementing 1.5 bits/cycle, illustrating the energy spent or consumed for a given input code. Both of the schemes implement 12.5% redundancy and have the capability to correct up to 3 erroneous decisions. The energy consumption shown in FIG. 5A may be computed through simulation software where the CDAC switching is more favorable to switch from VCM, i.e., a 01 output code occurrence is minimized in order to find the maximum energy consumed by the conversion or algorithm. This may be done by keeping into consideration that for a SAR data converter implementing redundancy, a single analog input value may be represented by different digital codes, enabling different switching procedures. The CCM-FRVSS of various embodiments may reduce energy consumption by at least approximately 90.2%, DAC size by approximately 50% and the digital logic required when compared to a known CDAC switching scheme using Vrefp and Vrefn as reference voltages to implement a 1.5 bit/cycle SAR ADC. In various embodiments, the additional switches for fractional reference voltage may be layout underneath the CDAC with one or more shielding metal layers.

The error correction of various embodiments will now be described by way of the following non-limiting examples. A single analog input value may be represented by different digital codes, enabling different switching procedures and opportunity for the error to propagate to the next bit cycle where it may be corrected due to the 12.5% redundancy facilitated error correction.

FIG. 6 shows a schematic of an (digital) error correction circuit or logic (or adder circuit) 640, according to various embodiments. The error correction logic 640 may be a ripple carry adder circuit. The error correction logic 640 may be an overlap and add (or addition) (only) error correction logic. In one embodiment, as illustrated in FIG. 6, the error correction circuit 640 may be implemented by utilizing (only) 7 full adders (FA) 642a, 642b, 642c, 642d, 642e, 642f, 642g, and 2 half adders (HA) 644a, 644b. The error correction circuit 640 may provide an example to correct 3 erroneous decisions. While the error correction logic 640 is illustrated in FIG. 6 for providing bits of a 10-bit digital output, it should be appreciated that this is a non-limiting example and the error correction circuit 640 may be suitably modified to provide bits of a digital output having any number of bits (or any resolution).

The error correction circuit 640 may receive the 2-bit code outputs ($A_nB_n$, where n is an integer) of the various conversion cycles and may provide bits of a digital output (or output value) ($D_n$, where n is an integer). The error correction circuit 640 may overlap and add respective bits of respective conversion cycles to provide a bit of the digital output. For example, the error correction circuit 640 may overlap and add the most significant bit (MSB) of a 2-bit code output of a current conversion cycle with the least significant bit (LSB) of a 2-bit code output of a previous conversion cycle.

For example, $A_2B_2$ may represent a 2-bit code output corresponding to a second conversion cycle where $A_2$ may represent the most significant bit (MSB) and $B_2$ may represent the least significant bit (LSB) of the 2-bit output code. Further, as illustrated in FIG. 6, using the bits $B_2$ and $A_3$ as a non-limiting example, $A_3$, being the MSB of the 2-bit output code of conversion cycle 3 (e.g., current cycle), may be overlapped with and added with $B_2$, being the LSB of the 2-bit output code of conversion cycle 2 (e.g., previous cycle, as cycle 3 occurs after or subsequent to cycle 2). The overlap and addition of $A_3$ and $B_2$ may be achieved at the full adder 642a which may provide the bit $D_3$ of the digital output. Such overlap and addition may be adopted for the 2-bit output codes of the various conversion cycles, as illustrated in FIG. 6. Where there may be an error, the error may propagate through the error correction circuit 640. Using the full adders 642f, 642g as a non-limiting example, in the event there may be an error, the error may propagate via the link 648 from the full adder 642g to the full adder 642f.

The error correction circuit 640, together with the buffer gate 646, may provide the bits of the output value (or digital output). The MSB, $D_1$, of the output value may be provided through the buffer gate 646 based on a 1-bit output code of conversion cycle 1. The bit, $D_2$, of the output value may be provided via the half adder 644a based on the MSB, $A_2$, of the 2-bit output code of conversion cycle 2. The next bit, $D_3$, of the output value may be provided via the full adder 642a based on the overlap and addition of the MSB, $A_3$, of the 2-bit output code of conversion cycle 3 and the LSB, $B_2$, of the 2-bit output code of conversion cycle 2. The remaining bits may then be similarly provided using the overlap and addition process. The last bit $D_{10}$, of the output value may be provided via the half adder 644b based on the overlap and addition of the LSB, $B_9$, of the 2-bit output code of cycle 9, and the logic value "1".

In various embodiments, irrespective of the erroneous bit cycle output, as the conversion progresses, the CDAC generated reference voltages may converge to the normalized analog input value.

Figure 7A:
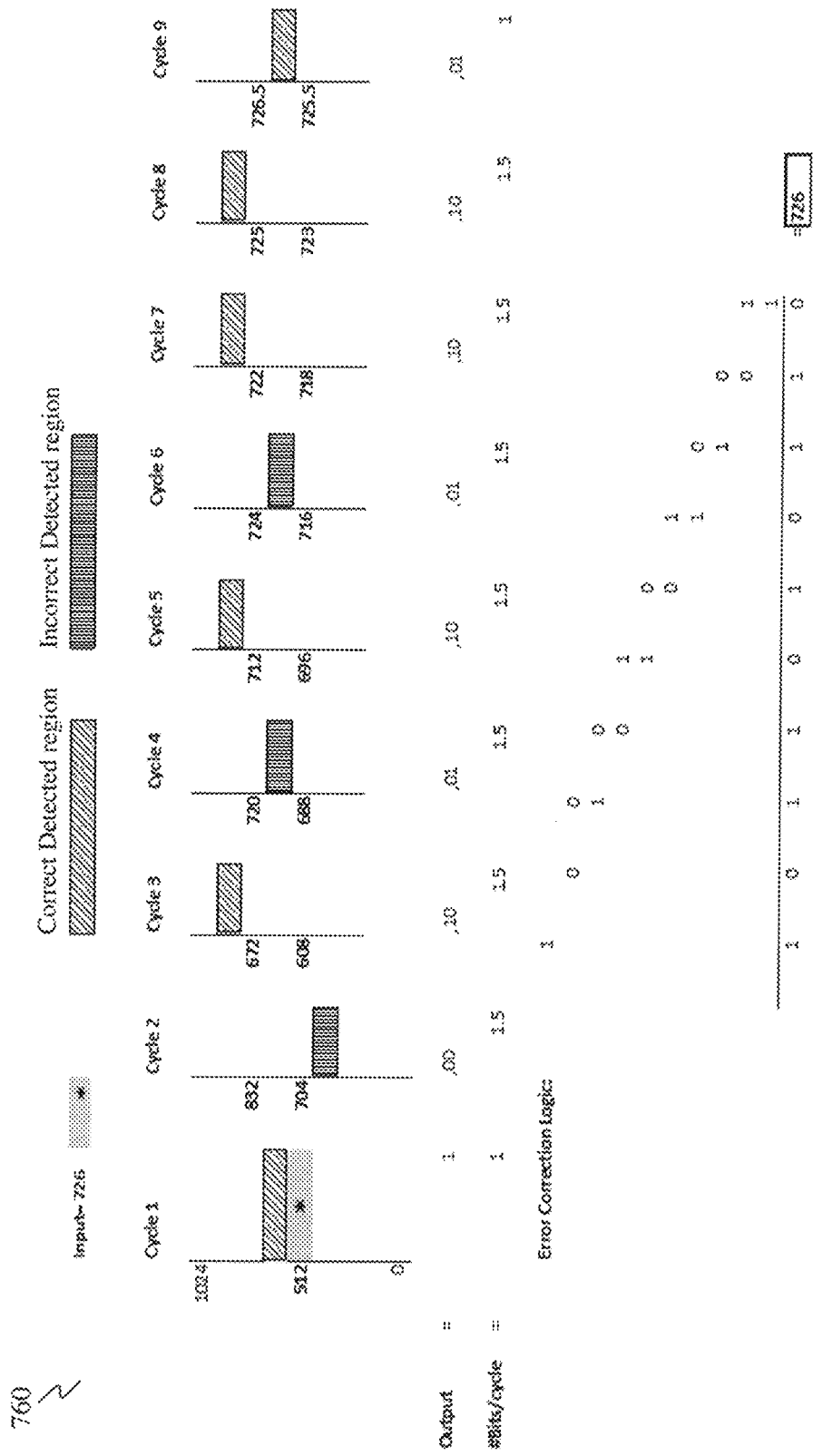
FIGS. 7A and 7B show schematics illustrating the redundancy algorithm, according to various embodiments. The example in FIG. 7A shows the digital conversion of a normalized input value of 726 mV with respect to a reference voltage ($V_{REF_p}$). The example in FIG. 7B shows the digital conversion of a normalized input value of 204 mV with respect to a reference voltage ($V_{REF_p}$).
Figure 7B:
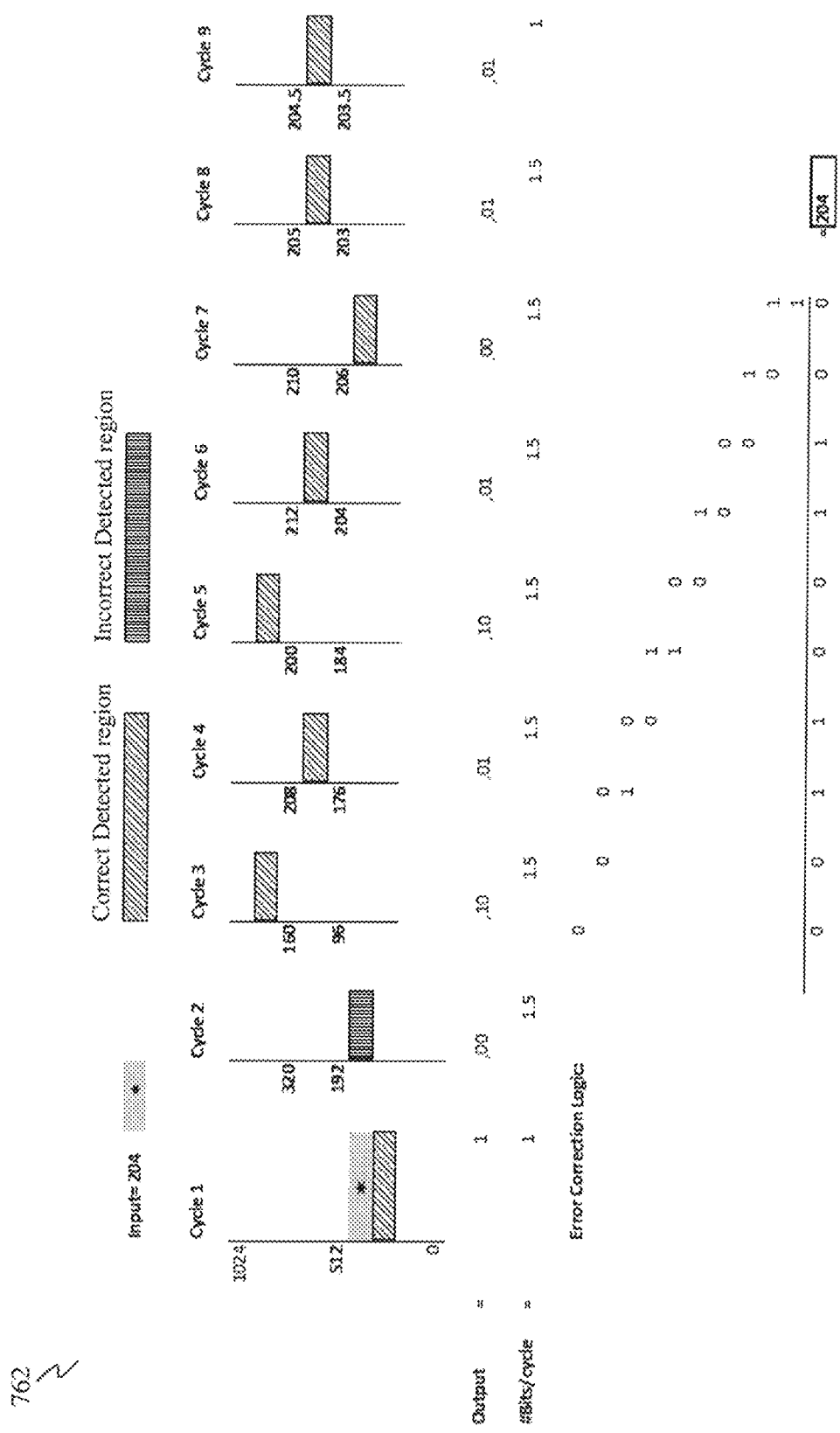

FIGS. 7A and 7B show schematics illustrating the redundancy algorithm, according to various embodiments. FIG. 7A shows a schematic diagram 760 illustrating the redundancy algorithm for a normalized input voltage of 726 mV. As may be observed in FIG. 7A, three erroneous decisions may be corrected. FIG. 7B shows a schematic diagram 762 illustrating the redundancy algorithm for a normalized input voltage of 204 mV, with one erroneous decision being corrected.

The related timing for various embodiments will now be described by way of the following non-limiting examples with reference to FIGS. 8 and 9.

Figure 8:
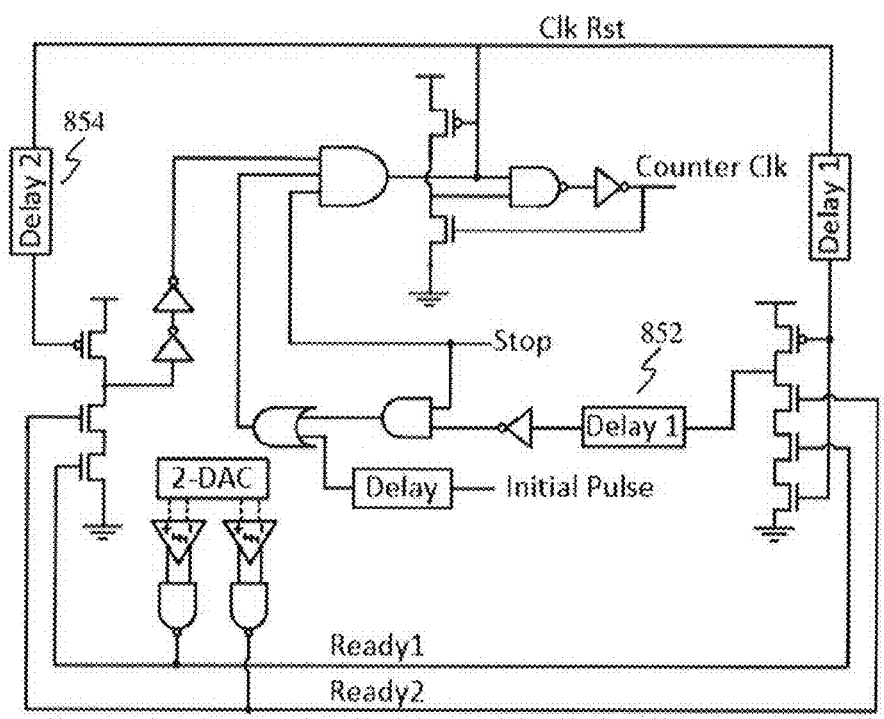
FIG. 8 shows a schematic of an asynchronous timing generator, according to various embodiments.

FIG. 8 shows a schematic of an asynchronous timing generator 850 (e.g., 250, FIG. 2A), according to various embodiments, illustrating an example of an implementation for an asynchronous timing scheme of various embodiments. Delay 1 852 and Delay 2 854 are digital logic which may delay one or more digital pulses by a certain time. The comparator ready signals 1 and 2 ("Ready1" and "Ready2), also as shown in the timing diagram (see FIG. 9), are involved in generating the high frequency internal clock required by the analog-to-digital converter (ADC) or data converter various embodiments to complete the required multiple conversion cycles. Stop signal ("Stop") terminates the pulse shape waveform in the asynchronous loop.

Figure 9:
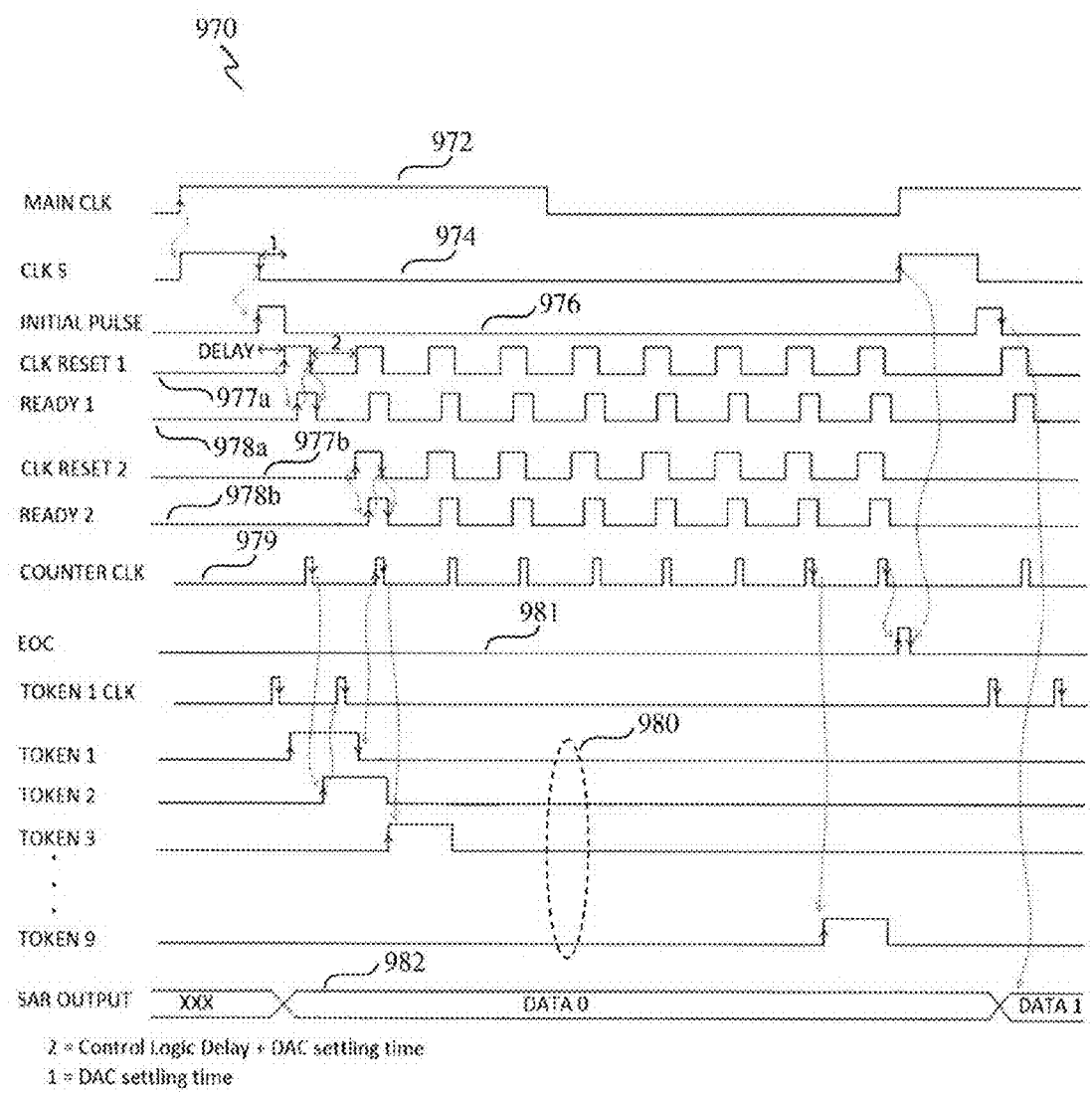
FIG. 9 shows a schematic of a timing diagram, according to various embodiments.

FIG. 9 shows a schematic of a timing diagram 970, according to various embodiments, illustrating an overall system timing diagram for the data converter or analog-to-digital converter (ADC) of various embodiments with redundancy. The timing diagram 970 illustrates a non-limiting example of an asynchronous timing diagram for various embodiments with a redundancy and error correction scheme. The main clock signal ("MAIN CLK") 972 is a low frequency clock for the asynchronous clocking logic (e.g., 250, FIG. 2A; 850, FIG. 8). This clock frequency may be equal to the sampling speed of the data converter or ADC (e.g., 200, FIG. 2A) of various embodiments. The positive edge of the main clock 972 may trigger the rising edge of a sampling clock signal ("CLK S") 974. The falling edge of the sampling clock 974 triggers an initial pulse ("INITIAL PULSE") 976, which may be used to charge the bottom plate of a capacitive DAC (e.g., 204a, 205b, FIG. 2A; 325, 327, FIG. 3A; 328, 329 FIG. 3B) to the common mode voltage $V_{CM}$. The positive edge of a clock reset 1 signal (CLK RST1 or "CLK RESET 1") 977a and the positive edge of a clock reset 2 (CLK RST2 or "CLK RESET 2") 977b may be used respectively to enable the dynamic comparators 1 and 2 (e.g., 202a, 202b, FIG. 2A). An asynchronous comparator ready signal is generated, respectively "READY 1" 978a and "READY 2" 978b. These two ready signals ("READY 1" 978a and "READY 2" 978b) may be used to respectively trigger the falling edge of the signals "CLK RESET 1" 977a and "CLK RESET 2" 977b and generate the signal or pulse for the next cycle's "CLK RESET 1" 977a and "CLK RESET 2" 977b. A counter clock signal ("COUNTER CLK") 979 may be used to generate the signals "TOKEN 1, 2, . . . , 9" 980. These tokens ("TOKEN 1, 2, . . . , 9" 980) may be used by the scheduler (or sequencer) (e.g., 218, FIG. 2A) to dynamically activate and schedule certain parts of the control logic and activate cycle wise redundancy (e.g., 223, 224, FIG. 2A). This may result in reducing the power consumption. In this way, the sequencer may be used to selectively activate parts of the control logic and activate cycle wise redundancy via a token generation system (Token 1 to 9 980), which may reduce static current. An end of conversion ("EOC") signal 981 may be triggered after the 9th counter clock ("COUNTER CLK" 979). A SAR output ("SAR OUTPUT" 982) data bus may be valid after every falling edge of the 'initial pulse' ("INITIAL PULSE" 976).

As described, an event driven asynchronous clock generation circuit (e.g., 850, FIG. 8) based on comparators' ready signal (e.g., "READY 1" 978a and "READY 2" 978b) may be used to generate high frequency internal bit cycle clocks. This may enable the sampling frequency (e.g., generated off-chip) to be the master clock (e.g., "MAIN CLK" 972), triggering the start of the sampling phase.

The measured results will now be described by way of the following non-limiting examples.

In various embodiments, an asynchronous 10 bits SAR ADC with redundancy and error correction capabilities may be fabricated on a silicon test chip with the relevant device or element blocks, e.g., DAC, control logic, asynchronous clock (or timing) generator, etc.

In various embodiments, an asynchronous 10-bit SAR ADC with redundancy and error correction with a unit cap of 0.75 fF may be implemented on a silicon die.

Figure 11:
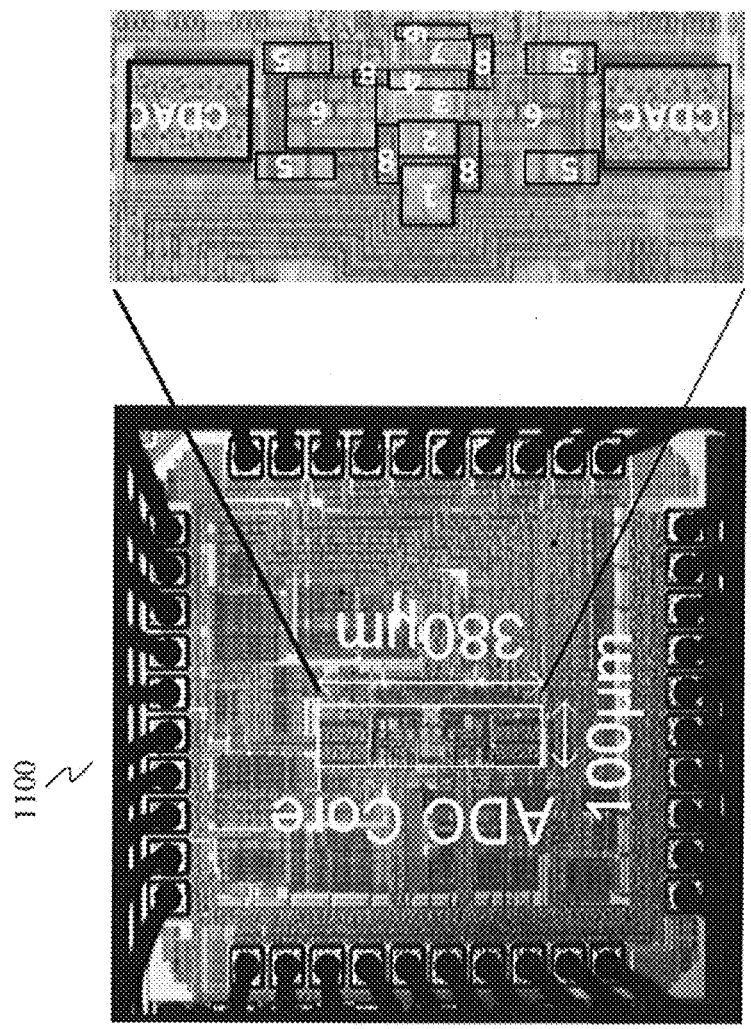
FIG. 11 shows a micrograph of a wire bonded die of various embodiments.

As a non-limiting example, FIG. 11 shows a micrograph 1100 of a wire bonded die of various embodiments. The die is fabricated in 65 nm 1P9M CMOS technology, with an active area of approximately 0.038 mm² including clock buffers, pre-driver buffer and power supply decoupling capacitors. The digital error correction circuit occupies approximately 38×7 µm².

Figure 10A:
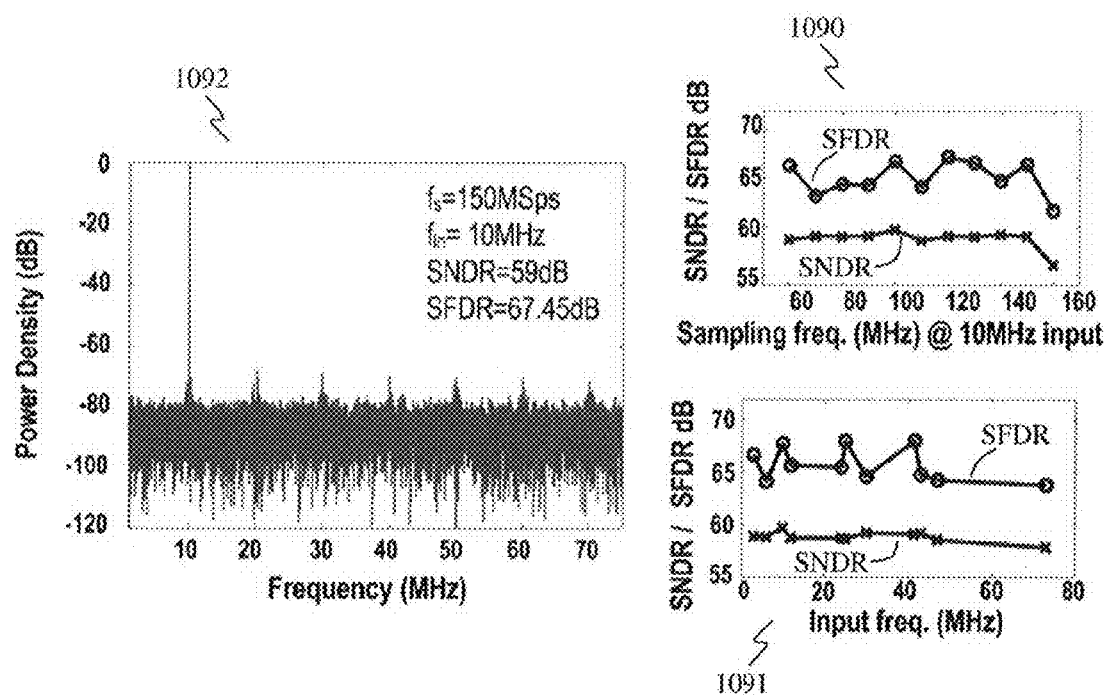
FIG. 10A shows plots of the measured dynamic performance of the analog-to-digital converter of various embodiments.
Figure 10B:
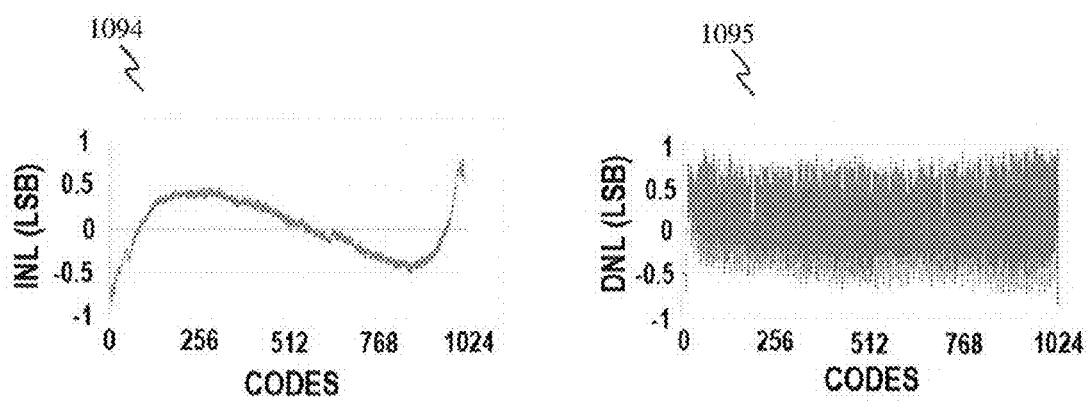
FIG. 10B shows plots of the measured integral non linearity (INL) and dynamic non linearity (DNL) of the analog-to-digital converter of various embodiments.

FIG. 10A shows plots 1090, 1091, 1092 of the measured dynamic performance of the analog-to-digital converter of various embodiments. Plot 1090 shows the measured signal-to-noise and distortion ratio (SNDR) and spurious-free dynamic range (SFDR) versus the sampling frequency for an input frequency of about 10 MHz, while plot 1091 shows the measured SNDR and SFDR versus the input frequency. Also shown in FIG. 10A is plot 1092 illustrating an output fast Fourier transform (FFT) spectrum for an input frequency of about 10 MHz. As may be observed in FIG. 10A, for an input frequency of about 10 MHz, the SNDR measured is about 59 dB and the SFDR measured is about 67.45 dB. For an input frequency close to the Nyquist frequency of about 73.03 MHz, the SNDR measured is about 57.81 dB and the SFDR measured is about 64.78 dB. A MOM unit capacitor of approximately 0.75 fF with a total CDAC of 384 fF is used for obtaining the measurements. FIG. 10B shows plots 1094, 1095 of the measured integral non linearity (INL) and dynamic non linearity (DNL) of the analog-to-digital converter of various embodiments. FIG. 10B shows the static performance with a peak INL of about +0.79/−0.87 LSB and a peak DNL of about +0.97/−0.83 LSB. The ADC operates at about 1.2 V and consumes approximately 4.06 mW at about 150 Msps leading to a Walden figure-of-merit (FOM) of approximately 42.6 fJ/conv-step at the Nyquist frequency.

As compared to known SAR ADCs, various embodiments may provide one or more advantages in terms of conversion speed (50% increment), reduced total bit cycles (9 cycles required including error correction), simple error correction logic (overlap and addition only-corrects up to 3 errors), 45% area reduction for error correction logic, no sacrifice to differential input range, CDAC simplicity, and zero latency with the same redundancy margins (no additional bit cycles required). Table 4 below provides a summary of the ADC of various embodiments.

TABLE 4

Non-limiting example of performance summary of the ADC of various embodiments.

| Feature/parameter | Embodiments |
| --- | --- |
| Architecture | SAR |
| Tech (nm) | 65 (1P9M) |
| Supply (V) | 1.2 |
| Resolution/Total Bit Cycles | 10b/9 |
| Digital Error Correction | 7 Full Adders, 2 Half Adders |
| Power (mW) | 4.06 |
| Sampling Rate (MSps) | 150 |
| Latency (addl. bit cycles) | No |
| Area (mm²) | 0.038 |
| Differential Input Range | 2.4 Vpp |

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An analog-to-digital converter (ADC) comprising:
a comparator arrangement comprising two comparators;
a digital-to-analog converter (DAC) arrangement comprising two DACs, wherein each DAC of the two DACs is connected to a respective comparator of the two comparators; and
an adder circuit connected to the comparator arrangement,
wherein the ADC is configured to receive an input value and further configured, over a plurality of conversion cycles of the ADC, to generate an output value representative of the input value,
wherein, for each respective DAC, the DAC is configured to sample the input value, and to generate a plurality of threshold levels over the plurality of conversion cycles, the sampled input value and the plurality of threshold levels to be received by the respective comparator, wherein the plurality of threshold levels are defined, at least in part, by predetermined redundancy levels that are binary-scaled over the plurality of conversion cycles and generated by the DAC, and, wherein a respective threshold level of the plurality of threshold levels is associated with a respective conversion cycle of the plurality of conversion cycles, wherein the comparator arrangement is configured to provide an output code for the respective conversion cycle based on the sampled input value and the respective threshold level associated with at least one of the two comparators, and, wherein, for at least two adjacent conversion cycles of the plurality of conversion cycles, the two comparators are adapted to collectively provide output codes having two bits based on the sampled input value and the respective threshold levels associated with the two comparators, wherein the respective threshold levels for a predetermined conversion cycle of the at least two adjacent conversion cycles is dependent on the output code having two bits of a previous conversion cycle of the at least two adjacent conversion cycles, and wherein the adder circuit is configured to provide a plurality of output bits corresponding to the output value, wherein the adder circuit is capable of overlapping and adding a first significant bit of the output code having two bits provided for the predetermined conversion cycle with a second significant bit of the output code having two bits provided for the previous conversion cycle to generate one output bit of the plurality of output bits.

2. The ADC as claimed in claim 1,
wherein, for an initial conversion cycle of the plurality of conversion cycles, the comparator arrangement is configurable to provide the output code having one bit, and
wherein, for each of remaining conversion cycles of the plurality of conversion cycles, the two comparators are adaptable to collectively provide the output code having two bits.

3. The ADC as claimed in claim 1,
wherein, for an initial conversion cycle of the plurality of conversion cycles, the comparator arrangement is configurable to be a 1 bit/cycle comparator arrangement, and
wherein, for each of remaining conversion cycles of the plurality of conversion cycles, the comparator arrangement is configurable to be a 1.5 bits/cycle comparator arrangement.

4. The ADC as claimed in claim 3, wherein the comparator arrangement is configurable to be a 1.5 bits/cycle comparator arrangement for each of all remaining conversion cycles of the plurality of conversion cycles.

5. The ADC as claimed in claim 1, wherein the ADC is adaptable to enable one of the two comparators for an initial conversion cycle of the plurality of conversion cycles, and to enable both of the two comparators for each of remaining conversion cycles of the plurality of conversion cycles.

6. The ADC as claimed in claim 1, wherein the ADC is configured to provide the output code for an initial conversion cycle of the plurality of conversion cycles as an output most significant bit corresponding to the output value.

7. The ADC as claimed in claim 1, wherein the threshold level for an initial conversion cycle of the plurality of conversion cycles is free of a predetermined redundancy level.

8. The ADC as claimed in claim 1, wherein the predetermined redundancy levels defining the respective threshold levels associated with the two DACs for the respective conversion cycle are of opposite signs.

9. The ADC as claimed in claim 1, wherein each DAC of the two DACs comprises at least one capacitive DAC arrangement connected to the respective comparator, the at least one capacitive DAC arrangement comprising a plurality of binary-weighted capacitors.

10. The ADC as claimed in claim 9,
wherein each comparator of the two comparators comprises a first input terminal and a second input terminal, and
wherein the at least one capacitive DAC arrangement of the respective DAC is connected to the first input terminal of the respective comparator.

11. The ADC as claimed in claim 9,
wherein each comparator of the two comparators comprises a first input terminal and a second input terminal,
wherein the at least one capacitive DAC arrangement of each DAC comprises:
a first capacitive DAC arrangement comprising a first plurality of binary-weighted capacitors; and
a second capacitive DAC arrangement comprising a second plurality of binary-weighted capacitors,
wherein the first capacitive DAC arrangement of the respective DAC is connected to the first input terminal of the respective comparator, and
wherein the second capacitive DAC arrangement of the respective DAC is connected to the second input terminal of the respective comparator.

12. The ADC as claimed in claim 9, wherein, for generating the respective threshold level for the respective conversion cycle, and dependent on the output code of a preceding conversion cycle, the at least one capacitive DAC arrangement of the respective DAC is configured to selectively switch to at least one of a predetermined common mode voltage, a first reference voltage or a second reference voltage.

13. The ADC as claimed in claim 12, wherein, for generating the predetermined redundancy levels for defining the respective threshold levels associated with the two comparators for the respective conversion cycle, the at least one capacitive DAC arrangement of one of the two DACs is further configured to sample a first fraction of the first reference voltage and the at least one capacitive DAC arrangement of another of the two DACs is further configured to sample a second fraction of the first reference voltage.

14. The ADC as claimed in claim 13,
wherein, for generating the respective threshold levels for the respective conversion cycle, at least one binary-weighted capacitor of the plurality of binary-weighted capacitors of the respective DAC is configured to selectively switch to at least one of the predetermined common mode voltage, the first reference voltage or the second reference voltage, and
wherein, for generating the predetermined redundancy levels for defining the respective threshold levels associated with the two comparators for the respective conversion cycle, another binary-weighted capacitor of the plurality of binary-weighted capacitors adjacent to and of a lower weightage than the at least one binary-weighted capacitor is configured, for one of the two DACs, to sample the first fraction of the first reference voltage, and for the other of the two DACs, to sample the second fraction of the first reference voltage.

15. The ADC as claimed in claim 1, wherein, for each conversion cycle starting from a third conversion cycle of the plurality of conversion cycles and ending in a final conversion cycle of the plurality of conversion cycles, the adder circuit is configurable to overlap and add the first significant bit of the output code having two bits for the predetermined conversion cycle with the second significant bit of the output code having two bits for the previous conversion cycle.

16. The ADC as claimed in claim 1, wherein the adder circuit comprises a ripple carry adder circuit or a carry save adder circuit.

17. The ADC as claimed in claim 1, wherein the adder circuit comprises a cascade array comprising a plurality of half adders and a plurality of full adders.

18. The ADC as claimed in claim 1, further comprising a sequencer configured to generate a plurality of token signals to enable generation of the respective predetermined redundancy level in response to a respective token signal of the plurality of token signals for the respective conversion cycle.

19. The ADC as claimed in claim 1, further comprising an asynchronous clock generator configured to generate respective clock signals for enabling the two comparators over the plurality of conversion cycles.

20. A method of controlling an analog-to-digital converter (ADC), the method comprising:
receiving an input value; and
generating an output value representative of the input value over a plurality of conversion cycles of the ADC, wherein generating an output value comprises:
via each respective digital-to-analog converter (DAC) of two DACs comprised in a DAC arrangement of the ADC, sampling the input value, and generating a plurality of threshold levels over the plurality of conversion cycles, the sampled input value and the plurality of threshold levels being received by a respective comparator of two comparators comprised in a comparator arrangement of the ADC, the respective comparator being connected to the respective DAC of the two DACs, wherein the plurality of threshold levels are defined, at least in part, by predetermined redundancy levels that are binary-scaled over the plurality of conversion cycles and generated by the DAC, and, wherein a respective threshold level of the plurality of threshold levels is associated with a respective conversion cycle of the plurality of conversion cycles;

providing, via the comparator arrangement, an output code for the respective conversion cycle based on the sampled input value and the respective threshold level associated with at least one of the two comparators, and, wherein, for at least two adjacent conversion cycles of the plurality of conversion cycles, providing, via the two comparators collectively, output codes having two bits based on the sampled input value and the respective threshold levels associated with the two comparators, wherein the respective threshold levels for a predetermined conversion cycle of the at least two adjacent conversion cycles is dependent on the output code having two bits of a previous conversion cycle of the at least two adjacent conversion cycles; and providing, via an adder circuit connected to the comparator arrangement, a plurality of output bits corresponding to the output value, wherein, for generating one output bit of the plurality of output bits, a first significant bit of the output code having two bits provided for the predetermined conversion cycle is overlapped and added by the adder circuit with a second significant bit of the output code having two bits provided for the previous conversion cycle.

* * * * *